(12) United States Patent
Hamada et al.

(10) Patent No.: US 11,194,105 B2
(45) Date of Patent: Dec. 7, 2021

(54) PHOTOELECTRIC CONVERSION ELEMENT, OPTICAL SUBASSEMBLY, AND METHOD FOR MANUFACTURING PHOTOELECTRIC CONVERSION ELEMENT

(71) Applicant: Lumentum Japan, Inc., Kanagawa (JP)

(72) Inventors: Hiroshi Hamada, Kanagawa (JP); Takashi Toyonaka, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/800,750

(22) Filed: Feb. 25, 2020

(65) Prior Publication Data
US 2020/0278507 A1 Sep. 3, 2020

(30) Foreign Application Priority Data
Feb. 28, 2019 (JP) .............................. JP2019-036123

(51) Int. Cl.
*G02B 6/42* (2006.01)
*H01S 5/026* (2006.01)

(52) U.S. Cl.
CPC .......... *G02B 6/4206* (2013.01); *H01S 5/0267* (2013.01)

(58) Field of Classification Search
None
See application file for complete search history.

(56) References Cited

U.S. PATENT DOCUMENTS

| | | | | |
|---|---|---|---|---|
| 5,451,766 A | * | 9/1995 | Berkel | H01L 27/14643 250/208.1 |
| 5,815,293 A | * | 9/1998 | Komma | G02B 3/10 359/19 |
| 8,315,287 B1 | * | 11/2012 | Roggero | H01S 5/04253 372/50.11 |
| 8,582,618 B2 | * | 11/2013 | Roggero | H01S 5/18 372/50.23 |
| 2002/0149827 A1 | * | 10/2002 | Fujimura | H01L 31/109 359/228 |
| 2005/0123016 A1 | * | 6/2005 | Behfar | H01S 5/18 372/50.1 |
| 2005/0226122 A1 | * | 10/2005 | Ooi | G11B 7/1353 369/112.05 |
| 2007/0127348 A1 | * | 6/2007 | Ooi | G02B 3/08 369/112.02 |
| 2008/0266638 A1 | * | 10/2008 | Shinoda | H01S 5/18 359/237 |

(Continued)

FOREIGN PATENT DOCUMENTS

JP 2008-277445 A 11/2008
JP 2017-199716 A 11/2017

*Primary Examiner* — Jerry Rahll
(74) *Attorney, Agent, or Firm* — Harrity & Harrity, LLP

(57) ABSTRACT

A photoelectric conversion element includes a substrate including a lens-shaped convex portion and an annular concave portion surrounding the lens-shaped convex portion on a first main surface; a photoelectric conversion layer, positioned on an optical path of light passing through the lens-shaped convex portion, on a second main surface side of the substrate; and a pattern disposed on an outer peripheral side of the annular concave portion on the first main surface and disposed to interpose the lens-shaped convex portion from a first direction and a second direction intersecting the first direction.

20 Claims, 23 Drawing Sheets

(56) References Cited

U.S. PATENT DOCUMENTS

| | | | | |
|---|---|---|---|---|
| 2010/0225834 A1* | 9/2010 | Li | ............................ | G02F 1/29 |
| | | | | 349/13 |
| 2010/0265983 A1* | 10/2010 | Adachi | ................ | G02B 6/4214 |
| | | | | 372/50.23 |
| 2013/0177277 A1* | 7/2013 | Fujiwara | .................. | G02B 6/32 |
| | | | | 385/33 |
| 2014/0153605 A1* | 6/2014 | Arimoto | ................... | H01S 5/18 |
| | | | | 372/50.11 |
| 2015/0214695 A1* | 7/2015 | Adachi | .................... | H01S 5/18 |
| | | | | 372/20 |
| 2017/0309658 A1* | 10/2017 | Hamada | .............. | H01L 27/1464 |
| 2019/0049752 A1* | 2/2019 | Van Heugten | ........... | G02B 3/08 |

* cited by examiner

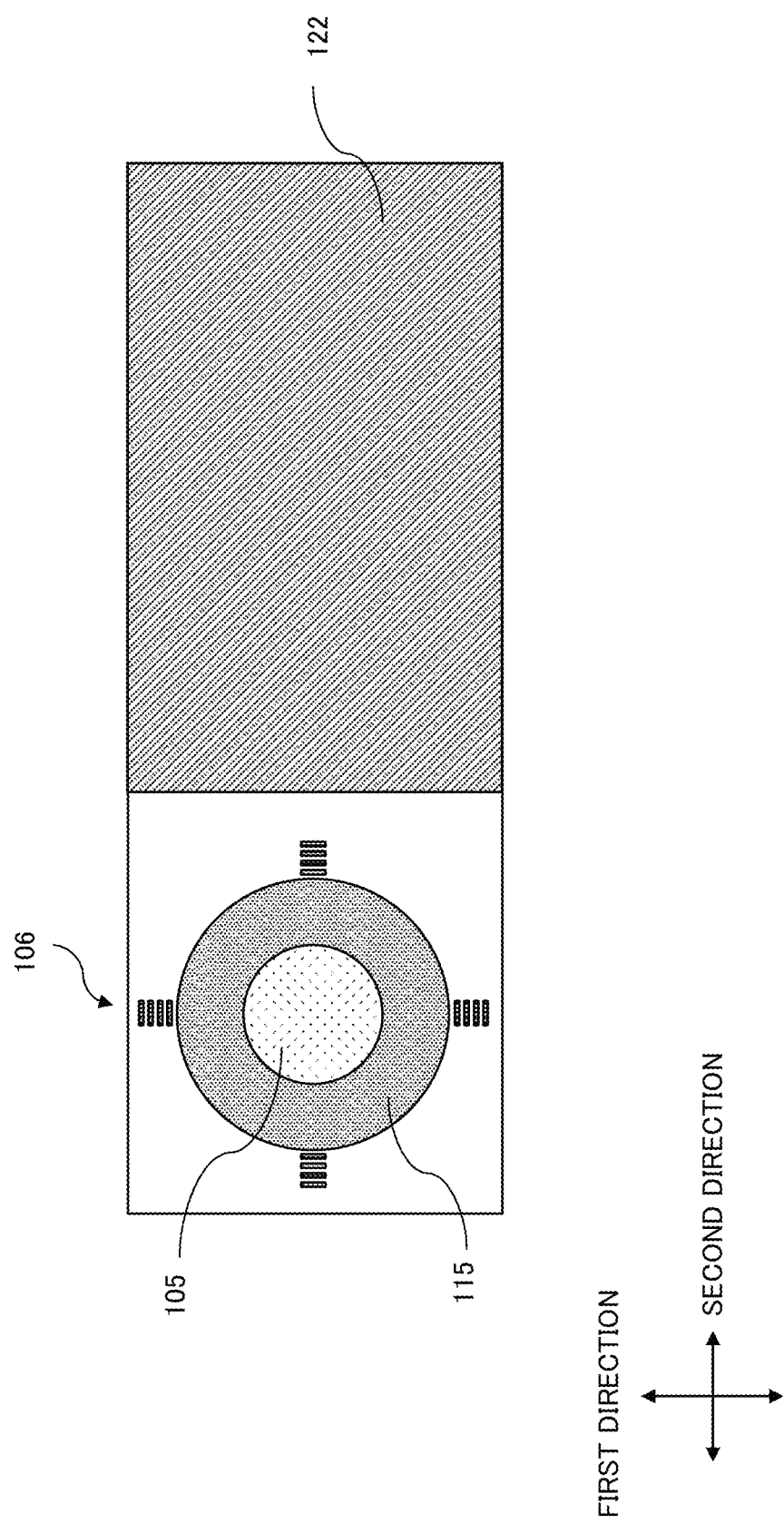

PHOTOELECTRIC CONVERSION ELEMENT, OPTICAL SUBASSEMBLY, AND METHOD FOR MANUFACTURING PHOTOELECTRIC CONVERSION ELEMENT

CROSS-REFERENCE TO RELATED APPLICATION

The present application claims priority from Japanese application JP 2019-036123 filed on Feb. 28, 2019, which is hereby expressly incorporated by reference herein.

TECHNICAL FIELD

The present disclosure relates to a photoelectric conversion element, an optical subassembly, and a method for manufacturing a photoelectric conversion element.

BACKGROUND

An optical subassembly on which a photoelectric conversion element is mounted may be required to be further miniaturized and high-density mounting technology may be required. Thus, it is desired to reduce the mounting area by arraying optical system components. When the arrayed optical components are used, high-density mounting is possible but it is difficult to individually adjust the optical axis of each channel. Therefore, in order to provide a wide tolerance width, a photoelectric conversion element in which a lens-shaped convex portion is provided on the rear surface of the substrate may be required.

Some devices may use a configuration in which a photoelectric conversion layer, such as a light absorption layer or an active layer, is provided on a front surface side of a semiconductor substrate, and a lens-shaped convex portion is provided on a rear surface side. In addition, a method of forming a lens-shaped convex portion on the rear surface of a semiconductor substrate may include forming a silicon nitride mask in a region where the lens-shaped convex portion on the rear surface side of the semiconductor substrate is to be formed, etching the periphery of the lens-shaped portion in a donut shape, then removing the silicon nitride mask and performing wet-etching.

However, when wet etching is performed to form a lens-shaped convex portion, there is a possibility that distortion occurs in the lens-shaped convex portion due to side etching in the wet etching process, and the position of the lens-shaped convex portion is shifted from a desired position. Therefore, it may be difficult to detect the distortion direction of the lens-shaped convex portion.

SUMMARY

According to some possible implementations, a photoelectric conversion element may include a substrate including a lens-shaped convex portion and an annular concave portion surrounding the lens-shaped convex portion on a first main surface; a photoelectric conversion layer, positioned on an optical path of light passing through the lens-shaped convex portion, on a second main surface side of the substrate; and a pattern disposed on an outer peripheral side of the annular concave portion on the first main surface and disposed to interpose the lens-shaped convex portion from a first direction and a second direction intersecting the first direction.

According to some possible implementations, an optical subassembly may include a photoelectric conversion element comprising: a substrate including a lens-shaped convex portion and an annular concave portion surrounding the lens-shaped convex portion on a first main surface; a photoelectric conversion layer, positioned on an optical path of light passing through the lens-shaped convex portion, on a second main surface side of the substrate; and a pattern disposed on an outer peripheral side of the annular concave portion on the first main surface and disposed to interpose the lens-shaped convex portion from a first direction and a second direction intersecting the first direction; a package housing the photoelectric conversion element therein; and an optical element housed in the package and making light incident on the photoelectric conversion element.

According to some possible implementations, a method for manufacturing a photoelectric conversion element forming a lens-shaped convex portion in a first region on a first main surface of a substrate, may include forming a photoelectric conversion layer positioned on an optical path of light passing through the lens-shaped convex portion on a second main surface side of the substrate; forming a pattern to interpose the first region from a first direction and a second direction intersecting the first direction on the first main surface; forming a mask for protecting at least a part of the pattern and the first region; forming, after the mask is formed, an annular concave portion surrounding the first region between the first region and the pattern; removing, after the annular concave portion is formed, the mask; and processing, after the mask is removed, the first region into a lens-shaped convex portion by wet etching.

BRIEF DESCRIPTION OF THE DRAWINGS

FIG. 23 is a schematic plan view illustrating a first main surface of the substrate in a photoelectric conversion element according to another example of the first example.

DETAILED DESCRIPTION

The following detailed description of example implementations refers to the accompanying drawings. The same reference numbers in different drawings may identify the same or similar elements.

Figure 1:
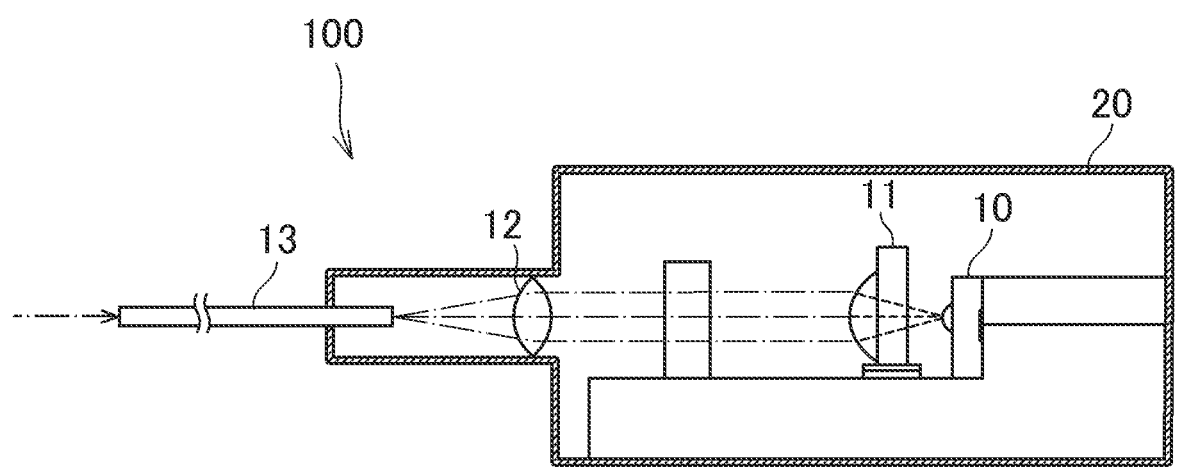
FIG. 1 is a schematic cross-sectional view of an optical subassembly on which a photoelectric conversion element according to a first example is mounted.

FIG. 1 is a schematic cross-sectional view of an optical subassembly 100 on which a photoelectric conversion element 10 is mounted. In the example illustrated in FIG. 1, an example in which the photoelectric conversion element 10 is a light receiving element having a light absorption layer is illustrated, but the present disclosure is not limited thereto. The photoelectric conversion element 10 may be a light emission element having an active layer or a modulator having an absorption layer (for example, an electroabsorption modulator).

In the example illustrated in FIG. 1, the optical subassembly 100 is a receiver optical subassembly (ROSA). The optical subassembly 100 includes the photoelectric conversion element 10, a condensing lens 11 and a collimating lens 12 that are optical elements, an optical fiber 13, and a package 20. The package 20 houses the photoelectric conversion element 10, the condensing lens 11, and the collimating lens 12 therein. The optical fiber 13 is provided to penetrate from the outside to the inside of the package 20 and guides the signal light to the inside of the package 20. The collimating lens 12 converts the signal light emitted from the optical fiber 13 into parallel light. The condensing lens 11 condenses the parallel light on the photoelectric conversion element 10. The structure of the optical subassembly 100 for obtaining the effects of the present disclosure described below is not limited to the structure illustrated in the present example. The package 20 of the optical subassembly 100 may be a cylindrical CAN type, or may have a structure without the optical fiber 13.

Figure 2:
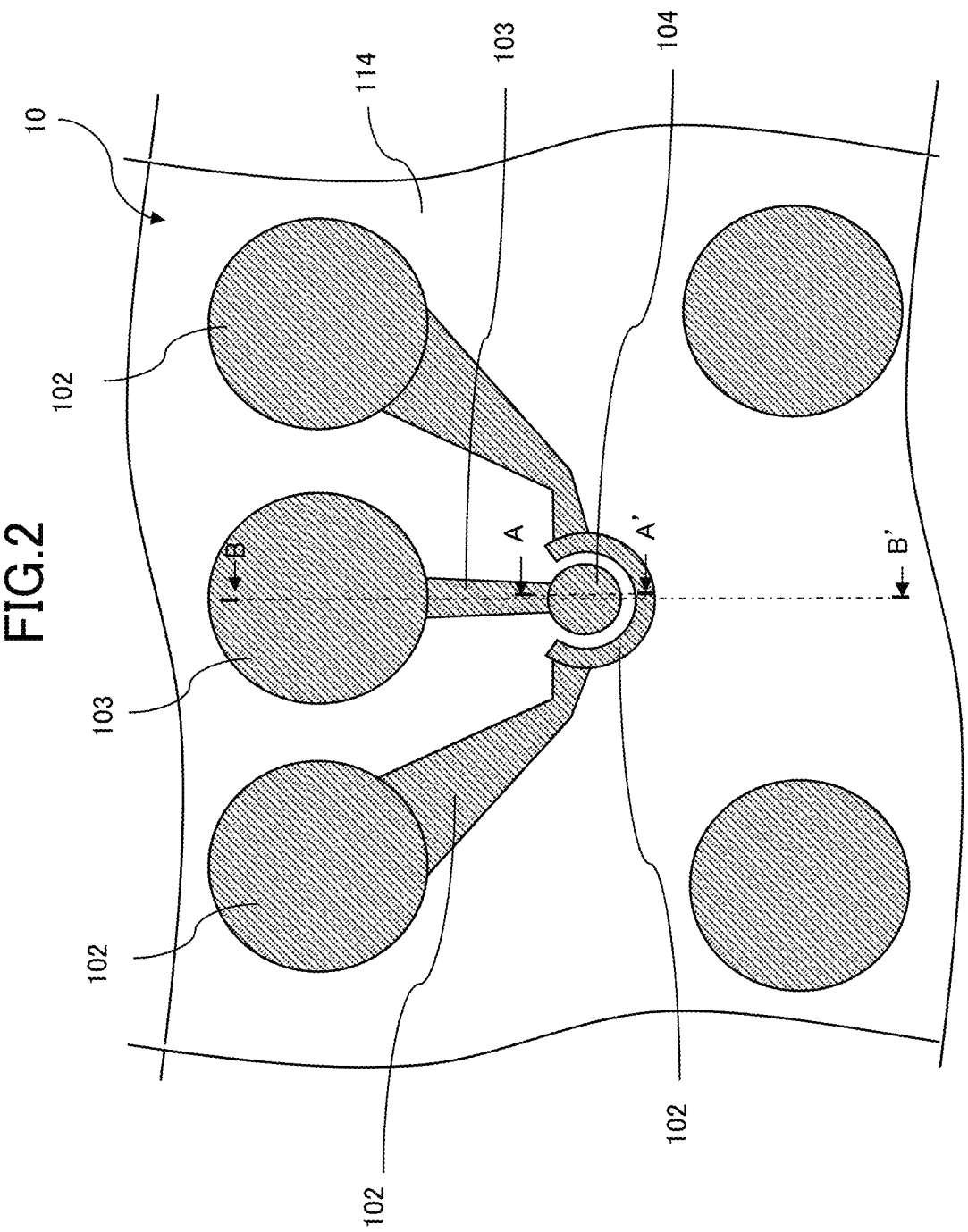
FIG. 2 is a schematic plan view illustrating the front surface of the photoelectric conversion element according to the first example.
Figure 3:
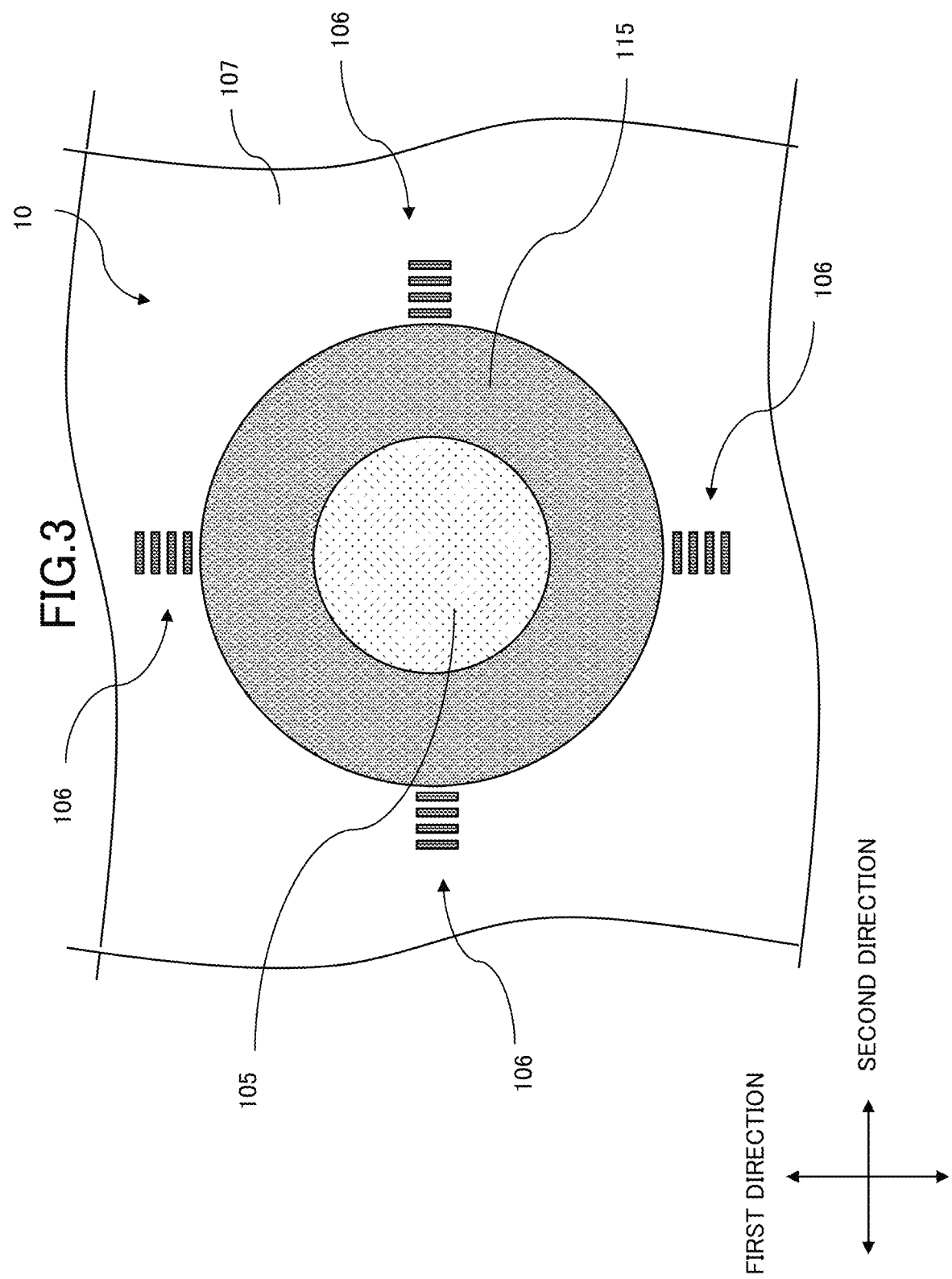
FIG. 3 is a schematic plan view illustrating the rear surface of the photoelectric conversion element according to the first example.
Figure 4:
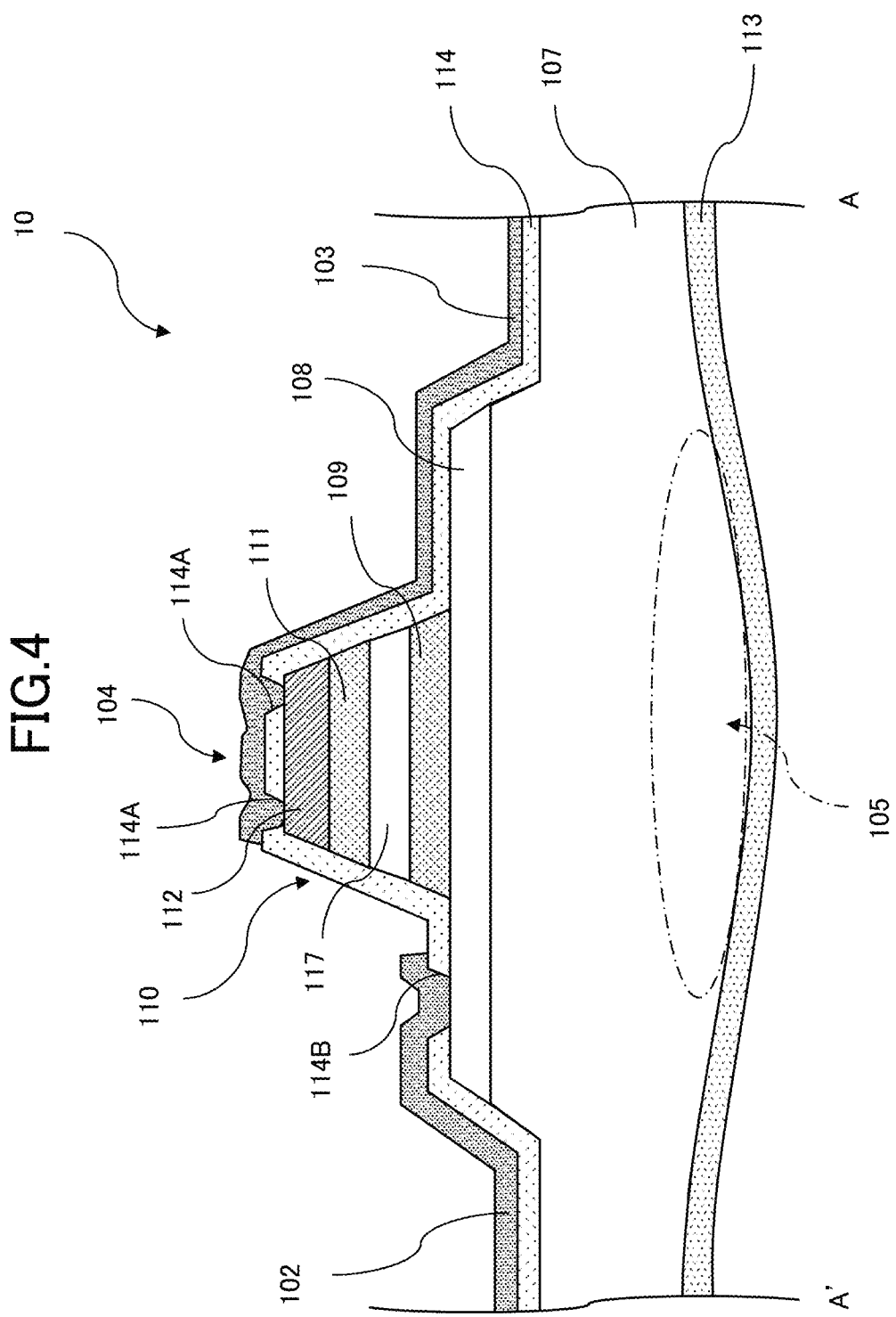
FIG. 4 is a schematic cross-sectional view illustrating the A-A' cross section of FIG. 2.
Figure 5:
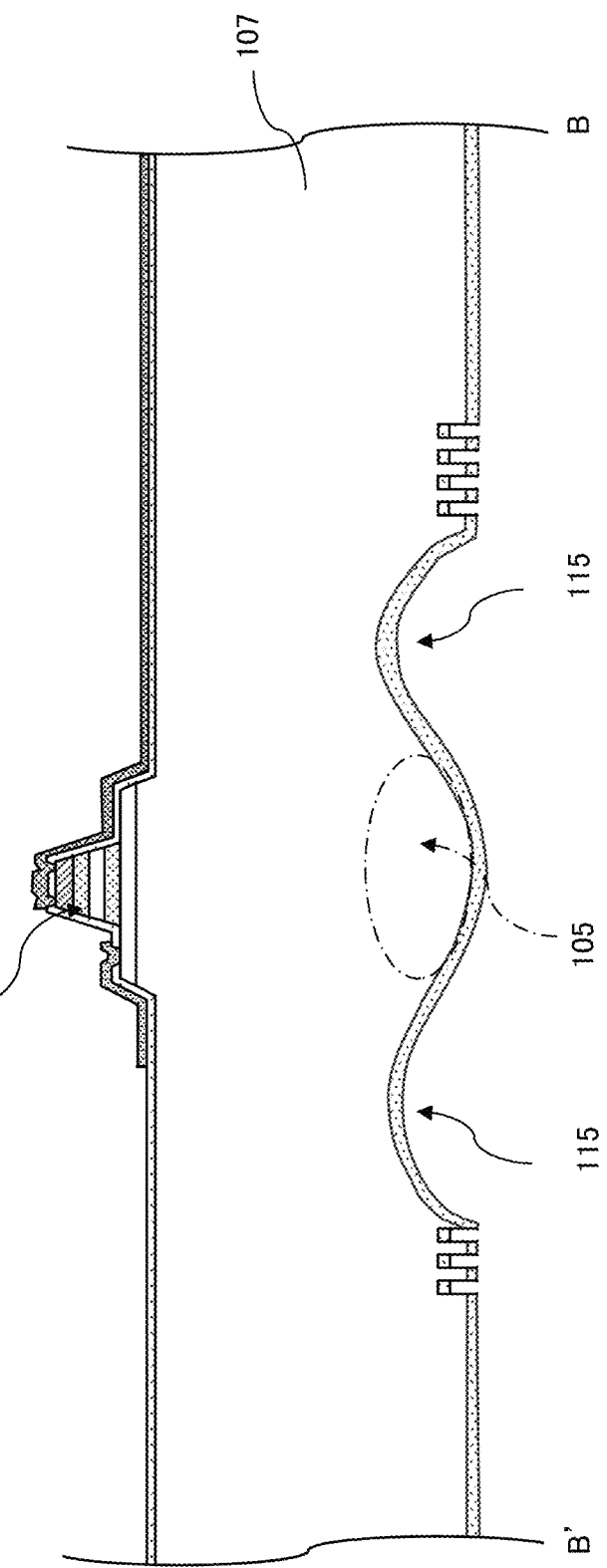
FIG. 5 is a schematic cross-sectional view illustrating the B-B' cross section of FIG. 2.

FIG. 2 is a schematic plan view illustrating the front surface of the photoelectric conversion element 10 according to the present implementation. FIG. 3 is a schematic plan view illustrating the rear surface of the photoelectric conversion element 10 according to the present implementation. FIG. 4 is a schematic cross-sectional view illustrating the A-A' cross section of FIG. 2. FIG. 5 is a schematic cross-sectional view illustrating the B-B' cross section of FIG. 2.

As illustrated in FIGS. 3, 4, and 5, the photoelectric conversion element 10 includes a substrate 107. The rear surface (first main surface) of the substrate 107 includes a lens-shaped convex portion 105, and light from the condensing lens 11 illustrated in FIG. 1 is incident on the lens-shaped convex portion 105. Further, as illustrated in FIGS. 3 and 5, the rear surface (first main surface) of the substrate 107 includes an annular concave portion 115 surrounding the lens-shaped convex portion 105.

As illustrated in FIG. 4, on the front surface (second main surface) side of the substrate 107, a semiconductor multilayer 110 having a photoelectric conversion function is disposed to overlap with the lens-shaped convex portion 105 when viewed from the direction orthogonal to the front surface (second main surface) side of the substrate 107. Since the present implementation illustrates an example in which the photoelectric conversion element 10 is a light receiving element, the semiconductor multilayer 110 includes a light absorption layer 117 as a photoelectric conversion layer. Thus, the light absorption layer 117 as a photoelectric conversion layer is located on the optical path of the light passing through the convex portion 105.

As illustrated in FIG. 3, the substrate 107 includes a pattern 106 disposed on the outer peripheral side of the annular concave portion 115 on the rear surface (first main surface) side. The pattern 106 is disposed to interpose the lens-shaped convex portion 105 from a first direction and a second direction intersecting the first direction. In addition, it is sufficient as long as the first direction and the second direction intersect each other, and the first direction and the second direction are not necessarily orthogonal.

With such a configuration, it is possible to detect the distortion direction of the lens-shaped convex portion. That is, in the wet etching process using a chemical solution for forming the lens-shaped convex portion 105, a flow of the chemical solution is generated in the beaker, thereby causing asymmetric distortion with respect to the center of the lens-shaped convex portion 105. Therefore, the position of the lens-shaped convex portion 105 may deviate from a desired position. Such distortion of the lens-shaped convex portion 105 is difficult to be visually determined. However, as described above, on the rear surface (first main surface) side of the substrate 107, by providing the pattern 106 disposed to interpose the lens-shaped convex portion 105 from two directions, it is possible to detect the direction of distortion generated in the lens-shaped convex portion 105 by observing the shape of the pattern 106 after the wet etching process, the distance between the pattern 106 and the annular concave portion 115, and the like.

Figure 6:
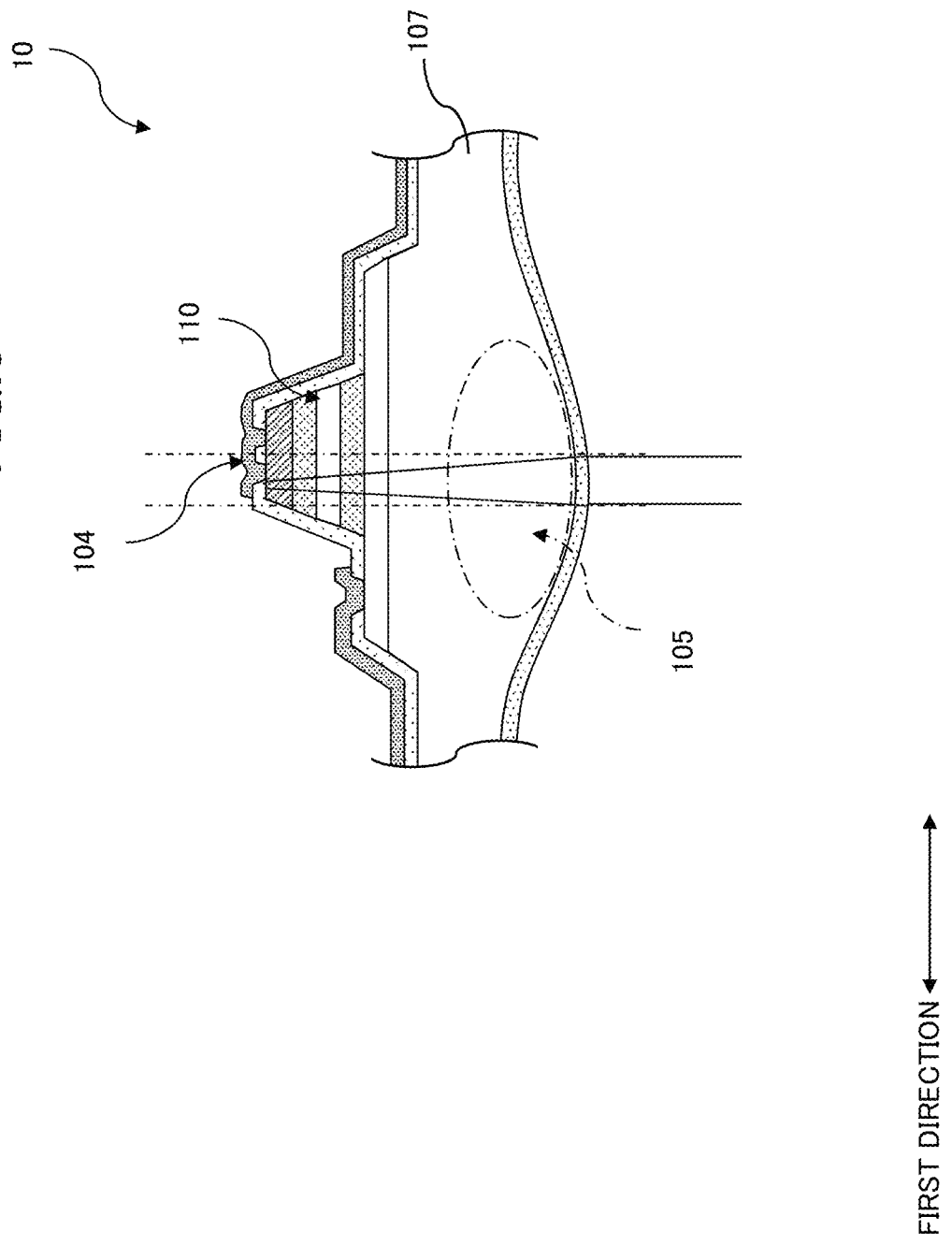
FIG. 6 is a schematic cross-sectional view illustrating a relationship between the photoelectric conversion element in a state where distortion is generated in a lens-shaped convex portion of the photoelectric conversion element according to the first example, and incident light.
Figure 7:
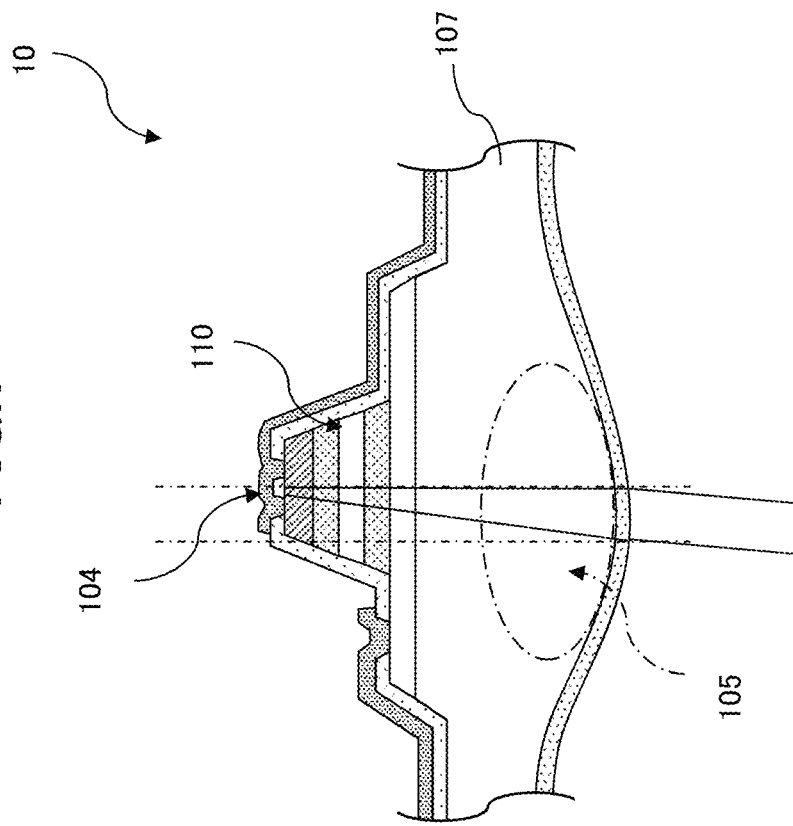
FIG. 7 is a schematic cross-sectional view illustrating a method for adjusting the incident angle of light in a state where distortion is generated in the lens-shaped convex portion of the photoelectric conversion element according to the first example.

As a result, it is possible to adjust the light incident condition in the optical subassembly 100 according to the direction of distortion generated in the lens-shaped convex portion 105. For example, in the example illustrated in FIG. 6, distortion is generated in the first direction, and the center position of the lens-shaped convex portion 105 is formed so as to be shifted in the first direction. In such a case, the light incident perpendicularly to the lens-shaped convex portion 105 is incident on a position shifted from the center of the semiconductor multilayer 110. On the other hand, as described above, by observing the shape of the pattern 106 after the wet etching process, the distance between the pattern 106 and the annular concave portion 115, and the like, the direction of distortion generated in the lens-shaped convex portion 105 is observed. Therefore, as illustrated in FIG. 7, it is possible to adjust the incident angle of light with respect to the lens-shaped convex portion 105. For example, it is possible to make light incident on the center position of the semiconductor multilayer 110 (particularly, the center position of the light absorption layer 117). In the above-described example, an example in which the incident angle is adjusted so that light is incident on the center position of the semiconductor multilayer 110 is illustrated, but the present disclosure is not limited thereto. It is effective in all examples in which the incident angle is adjusted so that light is incident on a desired position by detecting the direction of distortion generated in the lens-shaped convex portion 105. For example, the incident angle may be adjusted so that light is incident on the central position of a reflection portion 104 made of a metal film provided on the upper surface side of the semiconductor multilayer 110.

When the photoelectric conversion element 10 is a rear-surface light receiving photodiode as in the present implementation, the semiconductor multilayer 110 and the lens-shaped convex portion 105 are formed on the main surfaces on the opposite sides of the substrate 107. In such a configuration, it is difficult to directly compare the position of the semiconductor multilayer 110 and the position of the lens-shaped convex portion 105, but the deviation of the position of the lens-shaped convex portion 105 and the position of the semiconductor multilayer 110 can be detected by providing the above-described pattern 106. As a result, it is possible to improve the light receiving efficiency as the ROSA on which the photoelectric conversion element 10 is mounted.

In addition, there is a method of adjusting the mounting condition of the photoelectric conversion element 10 by acquiring data in which the light receiving sensitivity of the photoelectric conversion element 10 is mapped for each incident position of the light. However, according to the configuration of the present disclosure, since it is not necessary to perform shape measurement, dimension measurement, or the like of the lens-shaped convex portion 105, the direction of distortion generated in the lens-shaped convex portion 105 can be detected in a shorter time.

As illustrated in FIG. 4, in the photoelectric conversion element 10, an n-type contact layer 108, an n-type buffer layer 109, the light absorption layer 117, a p-type buffer layer 111, and a p-type contact layer 112 are sequentially formed on the front surface (second main surface) side of the substrate 107 made of, for example, semi-insulating InP doped with Fe. The n-type contact layer 108, the n-type buffer layer 109, the light absorption layer 117, the p-type buffer layer 111, and the p-type contact layer 112 constitute the semiconductor multilayer 110. The n-type contact layer 108, the n-type buffer layer 109, the light absorption layer 117, the p-type buffer layer 111, and the p-type contact layer 112 can be formed using, for example, a molecular beam epitaxy method. The semiconductor multilayer 110 is formed at a position overlapping the first region where the lens-shaped convex portion 105 is formed when viewed from the direction orthogonal to the front surface (second main surface) of the substrate 107. That is, the light absorption layer 117 which is the photoelectric conversion layer is formed so as to be positioned on the optical path of the light passing through the convex portion 105. In the example illustrated in FIG. 4, the light absorption layer 117 is an undoped absorption layer.

After the p-type contact layer 112 is formed, an insulating passivation film 114 is formed on the exposed surface of the substrate 107, the n-type contact layer 108, the n-type buffer layer 109, the light absorption layer 117, the p-type buffer layer 111, and the p-type contact layer 112. Thereafter, the passivation film 114 on the p-type contact layer 112 is partially removed by dry etching, thereby forming a through hole 114A. Further, the passivation film 114 on the n-type contact layer 108 is partially removed by dry etching, thereby forming a through hole 114B.

Thereafter, as illustrated in FIGS. 2 and 4, an n-type contact electrode 102 and a p-type contact electrode 103 are formed. The n-type contact electrode 102 is electrically connected to the n-type contact layer 108 through the through hole 114B, and the p-type contact electrode 103 is electrically connected to the p-type contact layer 112 through the through hole 114A. The n-type contact electrode 102 and the p-type contact electrode 103 can be filmed by vapor deposition of a metal such as gold, for example.

The p-type contact electrode 103 formed on the p-type contact layer 112 has a function as the reflection portion 104. The reflection portion 104 reflects the light transmitted through the semiconductor multilayer 110 out of the light incident from the rear surface (first main surface) side of the substrate 107 and causes the reflected light to enter the light absorption layer 117 again.

Figure 8:
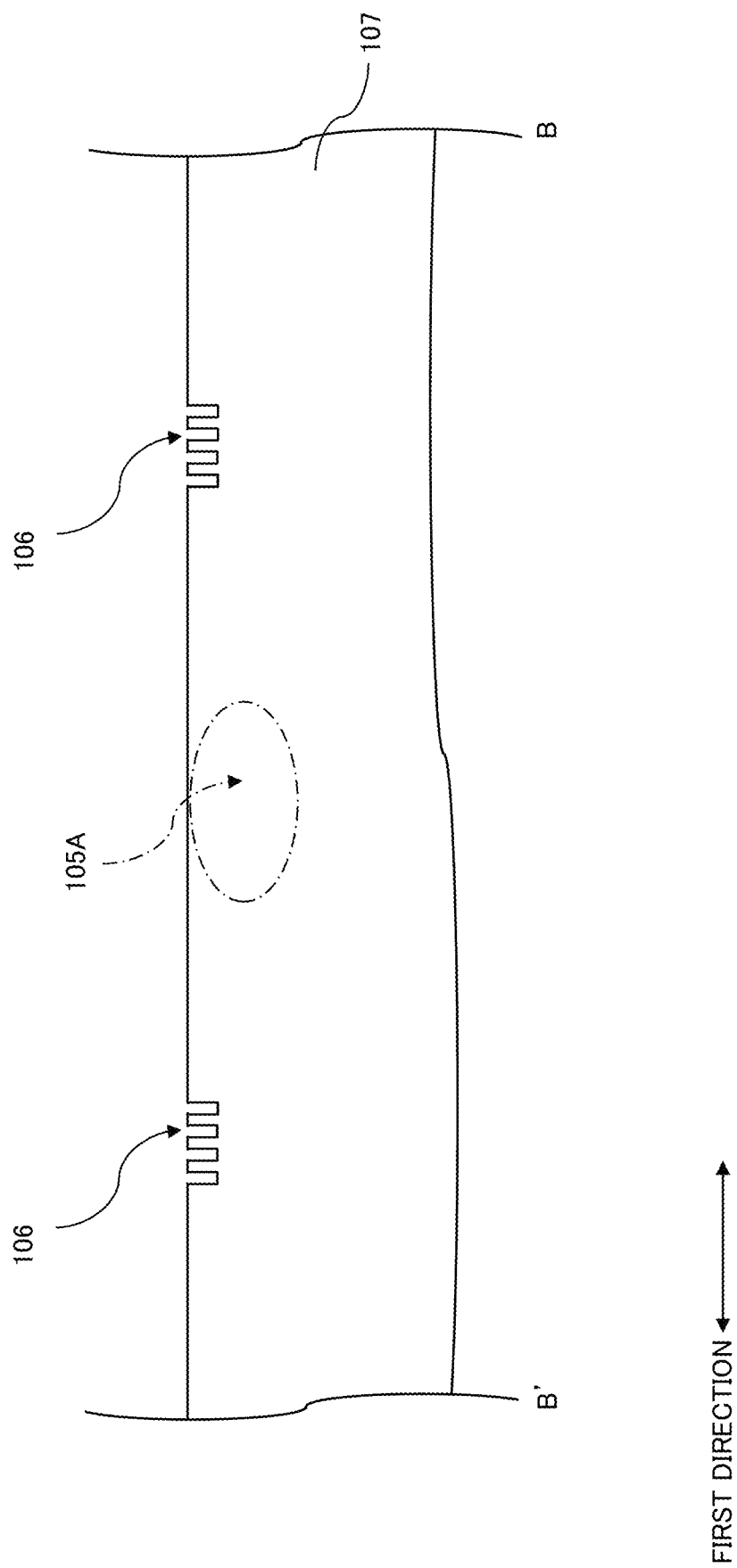
FIG. 8 is a schematic cross-sectional view illustrating a manufacturing process in the B-B' cross section of FIG. 2.

FIG. 8 is a schematic cross-sectional view illustrating a manufacturing process in the B-B' cross section of FIG. 2. In FIG. 8, the rear surface (first main surface) of the substrate 107 is displayed on the top, and the front surface (second main surface) of the substrate 107 is displayed on the bottom. As illustrated in FIG. 8, the pattern 106 is formed on the rear surface (first main surface) side of the substrate 107.

In the present implementation, the pattern 106 is formed by dry etching. Further, the pattern 106 is formed so that the depth of the pattern 106 is shallower than the depth of the annular concave portion 115 described later. The pattern 106 may be formed, for example, by vapor deposition of a metal film on the rear surface (first main surface) side of the substrate 107. However, it is desirable that the pattern 106 be formed in a desired region with high positional accuracy by forming the pattern 106 as a groove having a depth shallower than the depth of the annular concave portion 115 by dry etching. That is, compared with the formation of the metal film by vapor deposition, the formation of the groove by dry etching can obtain higher positional accuracy. Furthermore, by making the depth of the pattern 106 shallower than the depth of the concave portion 115, the occurrence of positional deviation during etching can be suppressed. Further, the pattern 106 can have a fine shape.

Figure 9:
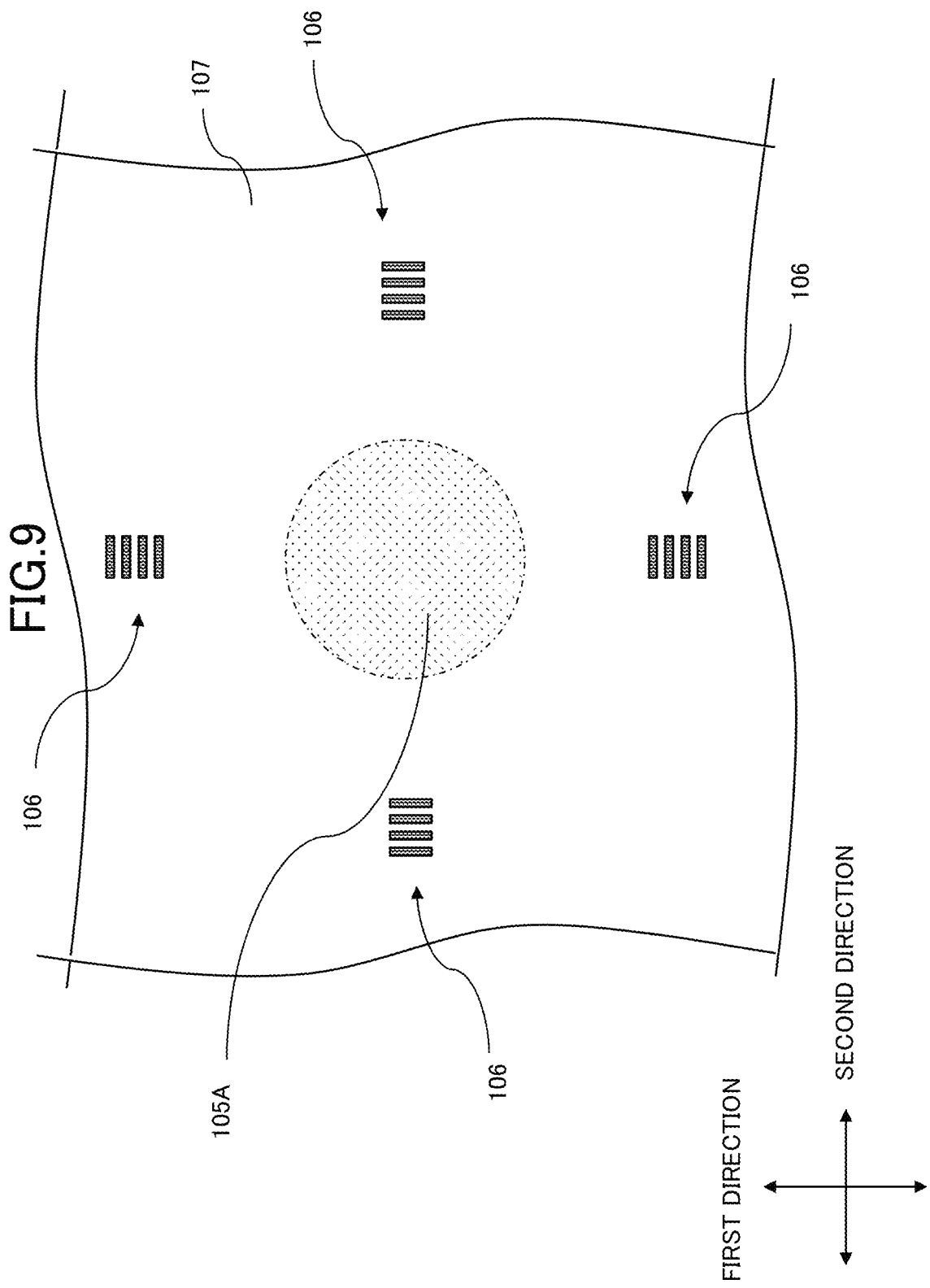
FIG. 9 is a schematic plan view illustrating a manufacturing process of the rear surface of the photoelectric conversion element according to the first example.

For example, as illustrated in FIG. 9, the pattern 106 is formed to interpose a first region 105A where the lens-shaped convex portion 105 is formed from the first direction and the second direction intersecting the first direction. In the example illustrated in FIG. 9, the pattern 106 includes a plurality of portions aligned in the first direction and a plurality of portions aligned in the second direction. The plurality of portions aligned in the first direction interpose the first region 105A in the first direction, and the plurality of portions aligned in the second direction interpose the first region 105A in the second direction.

Figure 10:
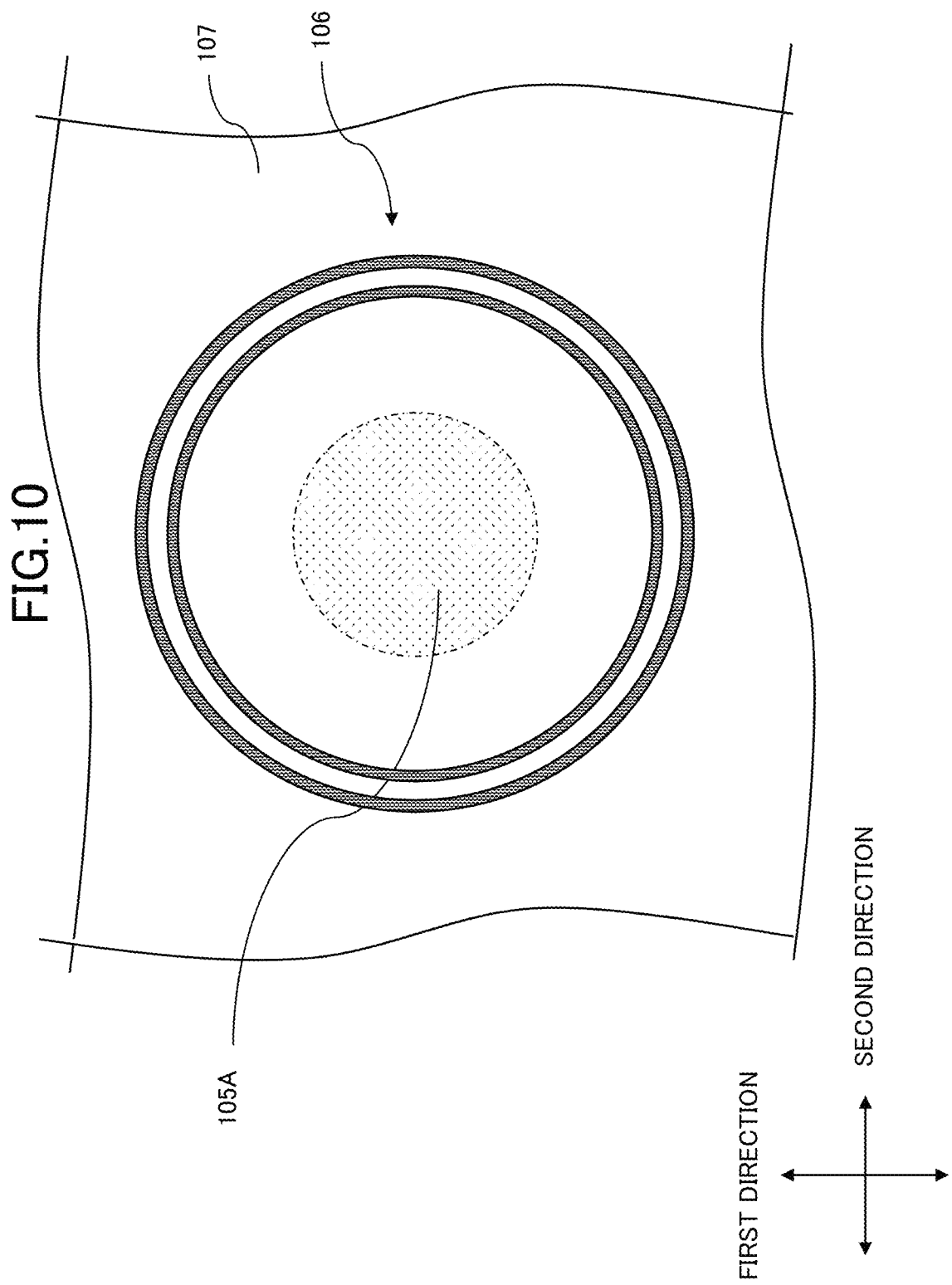
FIG. 10 is a schematic plan view illustrating a manufacturing process of the rear surface of the photoelectric conversion element according to another example of the first example.
Figure 11:
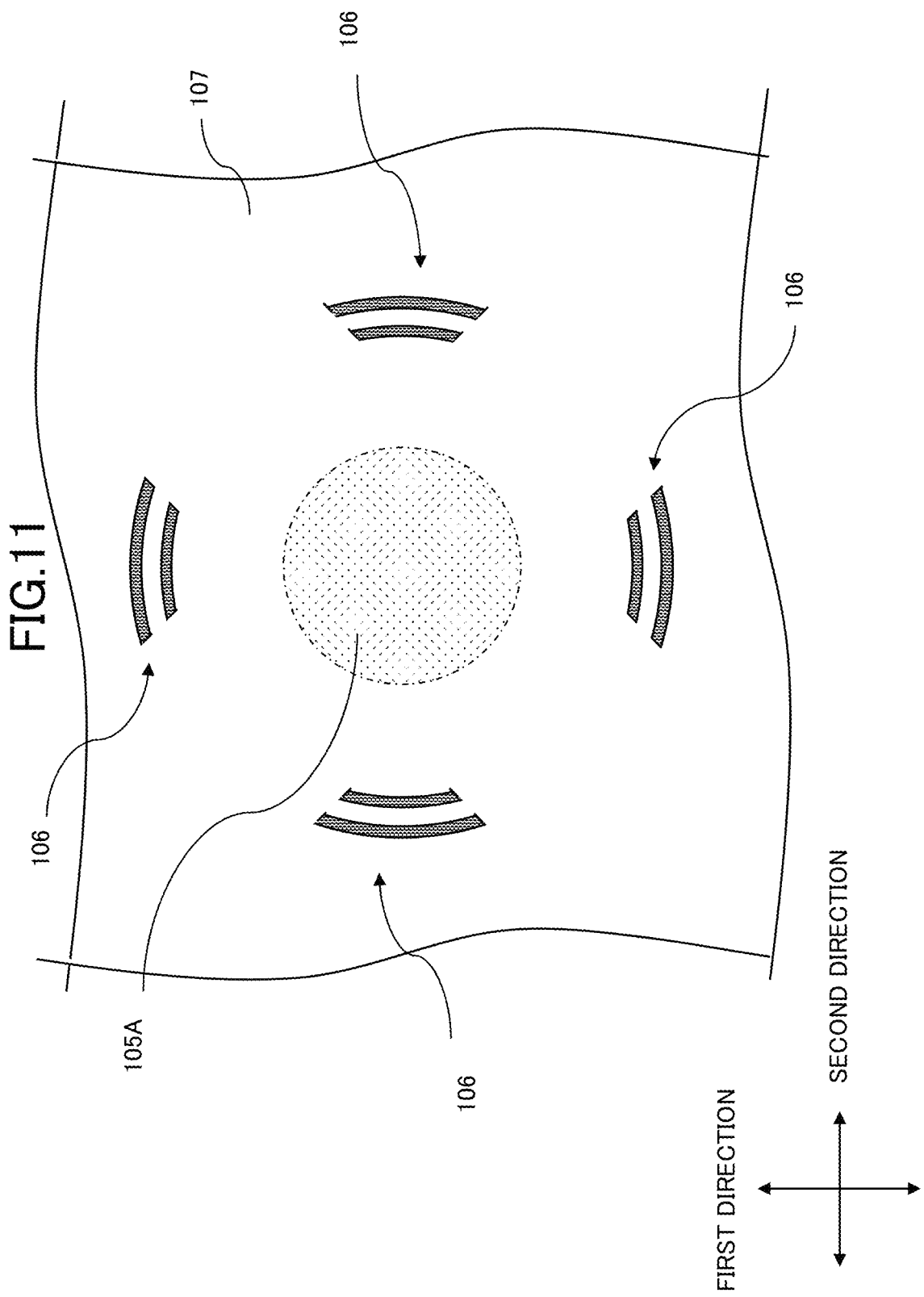
FIG. 11 is a schematic plan view illustrating a manufacturing process of the rear surface of the photoelectric conversion element according to another example of the first example.
Figure 12:
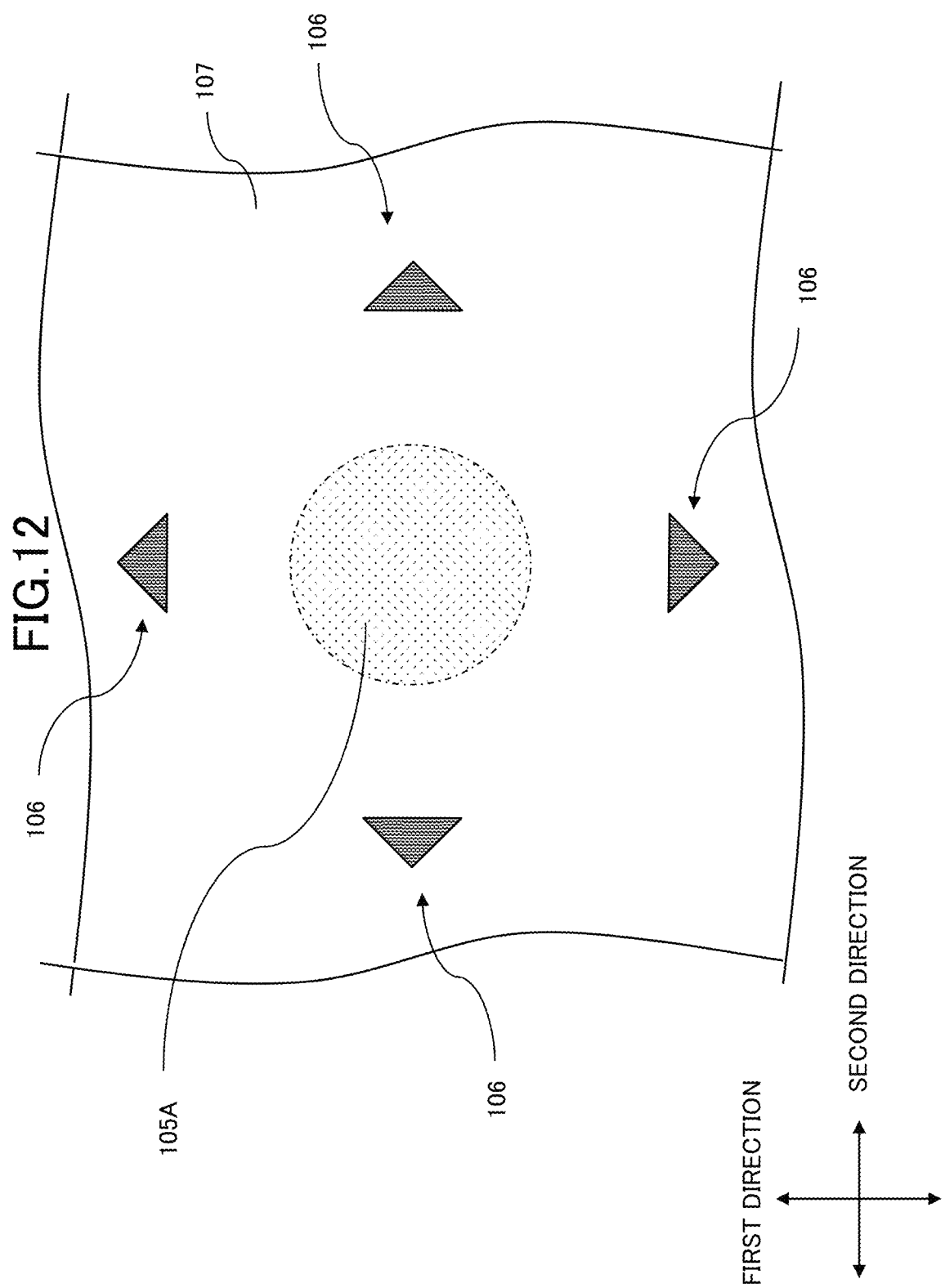
FIG. 12 is a schematic plan view illustrating a manufacturing process of the rear surface of the photoelectric conversion element according to another example of the first example.

The pattern 106 is not limited to the example illustrated in FIG. 9, and may have other configurations as long as the pattern 106 is disposed to interpose the first region 105A from the first direction and the second direction intersecting the first direction. For example, as illustrated in FIG. 10, the annular pattern 106 is disposed to interpose the first region 105A from all directions including the first direction and the second direction intersecting with each other. Further, as illustrated in FIG. 11, the arc-shaped pattern 106 may be disposed to interpose the first region 105A from the first direction and the second direction. Further, as illustrated in FIG. 12, the polygonal pattern 106 such as a triangle may be disposed to interpose the first region 105A from the first direction and the second direction.

In the examples illustrated in FIGS. 9, 10, 11, and 12, the pattern 106 has a configuration to be formed in a concentric circle centering on a part of the first region 105A. That is, after the first region 105A is processed into the lens-shaped convex portion 105, the pattern 106 is formed in a concentric circle centering on a part of the lens-shaped convex portion.

Figure 13:
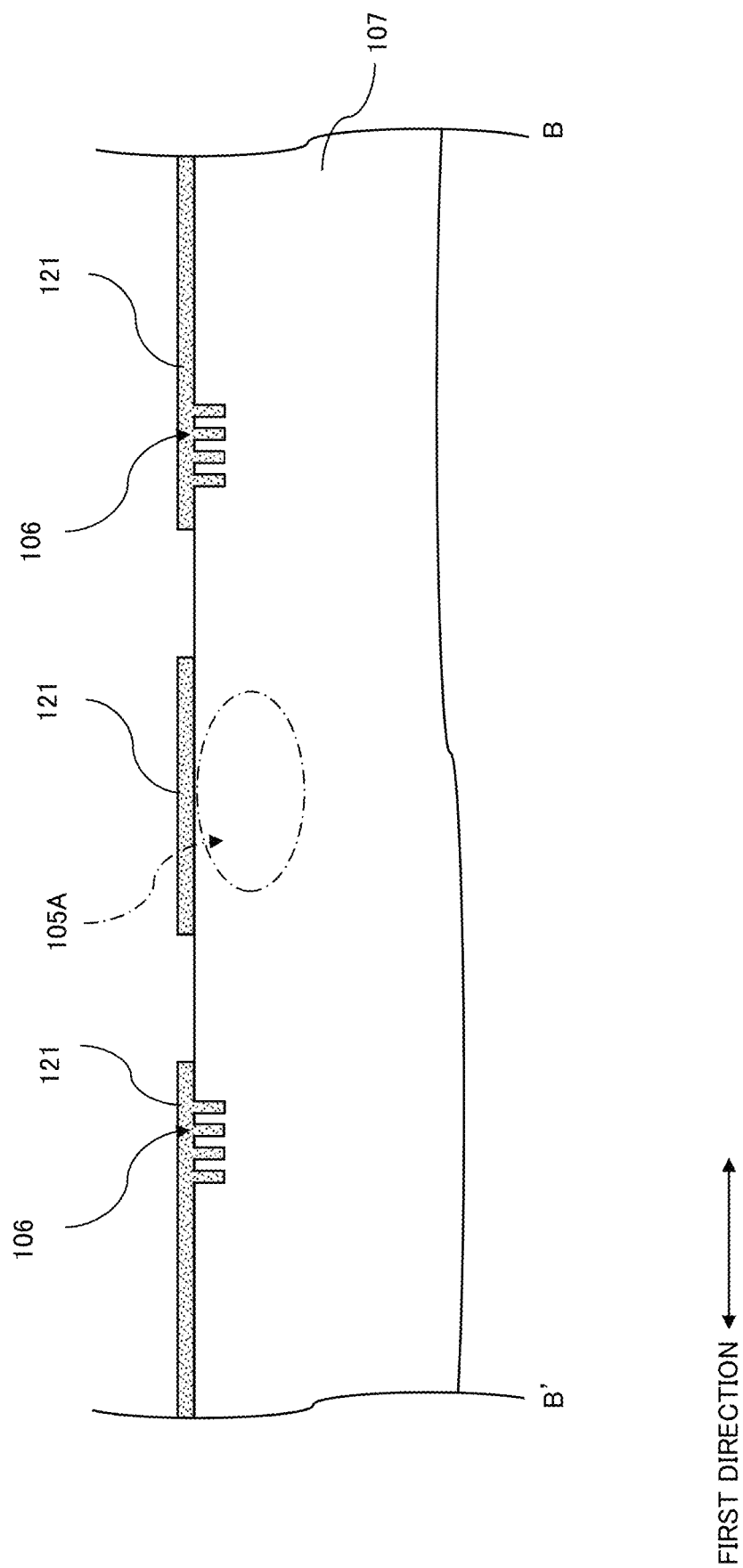
FIG. 13 is a schematic cross-sectional view illustrating a manufacturing process in the B-B' cross section of FIG. 2.
Figure 14:
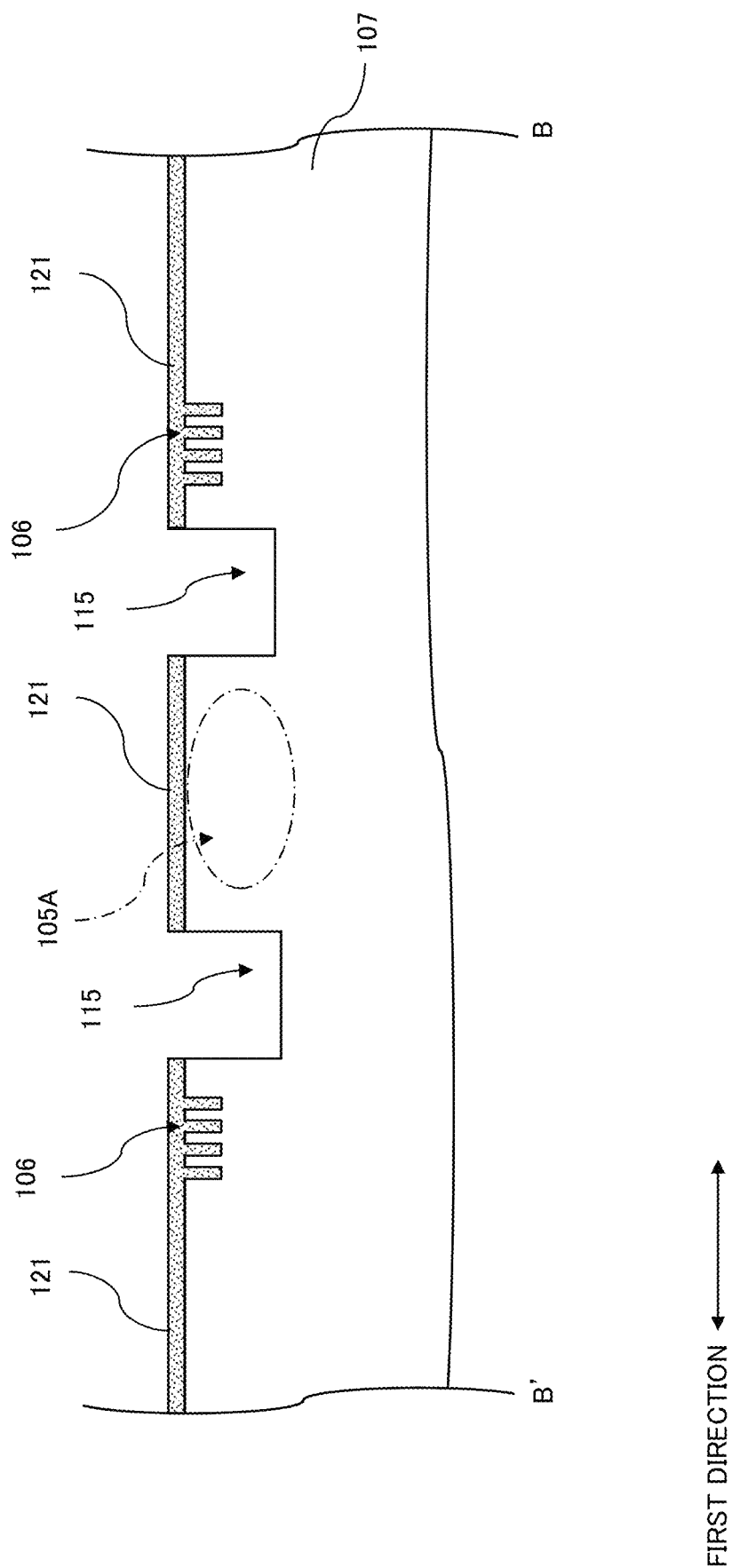
FIG. 14 is a schematic cross-sectional view illustrating a manufacturing process in the B-B' cross section of FIG. 2.

Next, as illustrated in FIG. 13, after forming a mask 121 that protects at least a part of the pattern 106, and the first region 105A, the annular concave portion 115 is formed, for example, by dry etching, as illustrated in FIG. 14. The annular concave portion 115 is formed between the first region 105A and the pattern 106 to surround the first region 105A.

Figure 15:
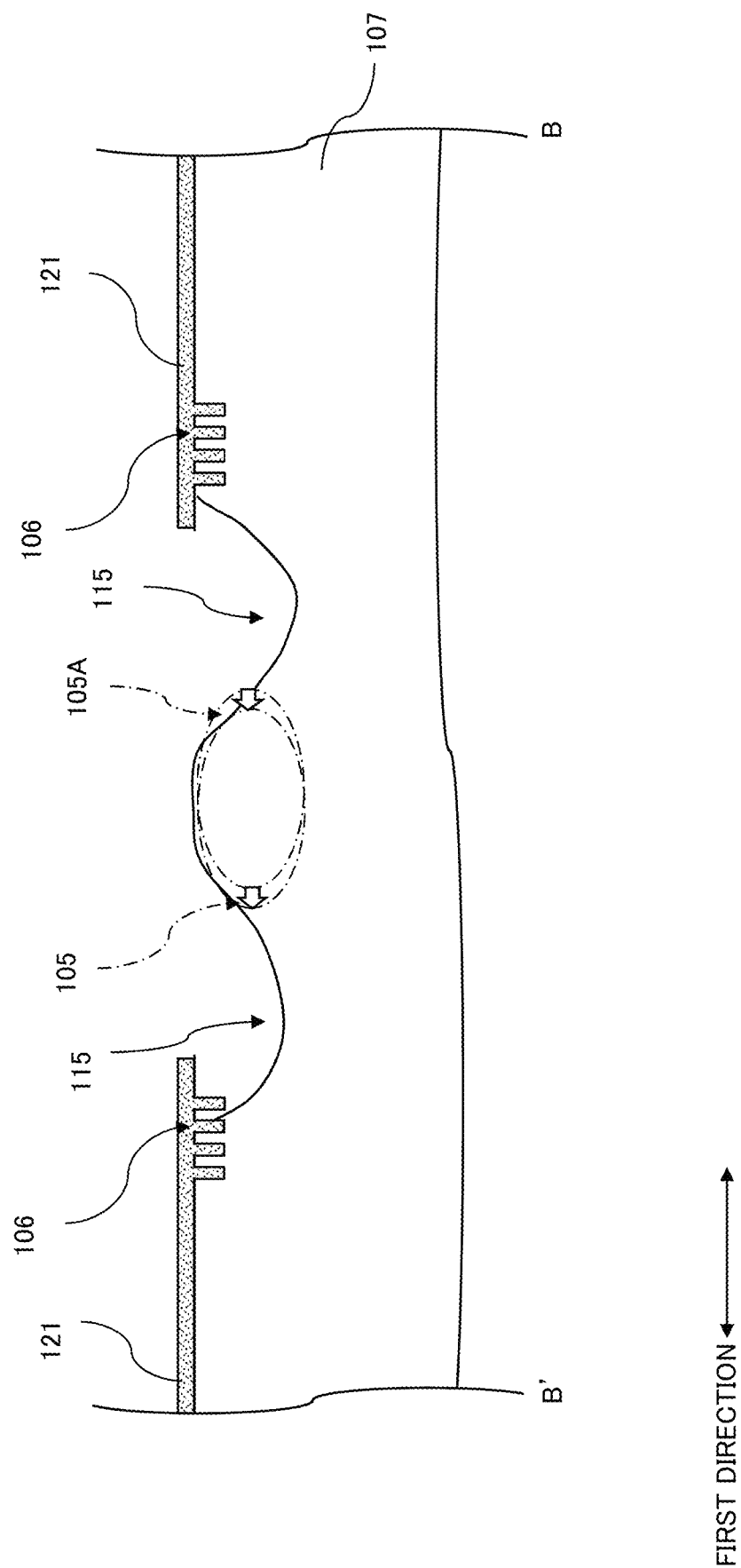
FIG. 15 is a schematic cross-sectional view illustrating a manufacturing process in the B-B' cross section of FIG. 2.

Thereafter, as illustrated in FIG. 15, the mask 121 provided on the first region 105A is removed, and the first region 105A is processed into the lens-shaped convex portion 105 by wet etching. At this time, since the mask 121 formed on the pattern 106 is left without being removed, the pattern 106 is not wet-etched from above. However, according to the flow of the chemical solution, the outer peripheral side of the annular concave portion 115 may be side-etched and a part of the pattern 106 may disappear. In the example illustrated in FIG. 15, in the wet etching process, asymmetric distortion occurs with respect to the center of the lens-shaped convex portion 105, and the position of the lens-shaped convex portion 105 is shifted from the first region 105A in the first direction.

Figure 16:
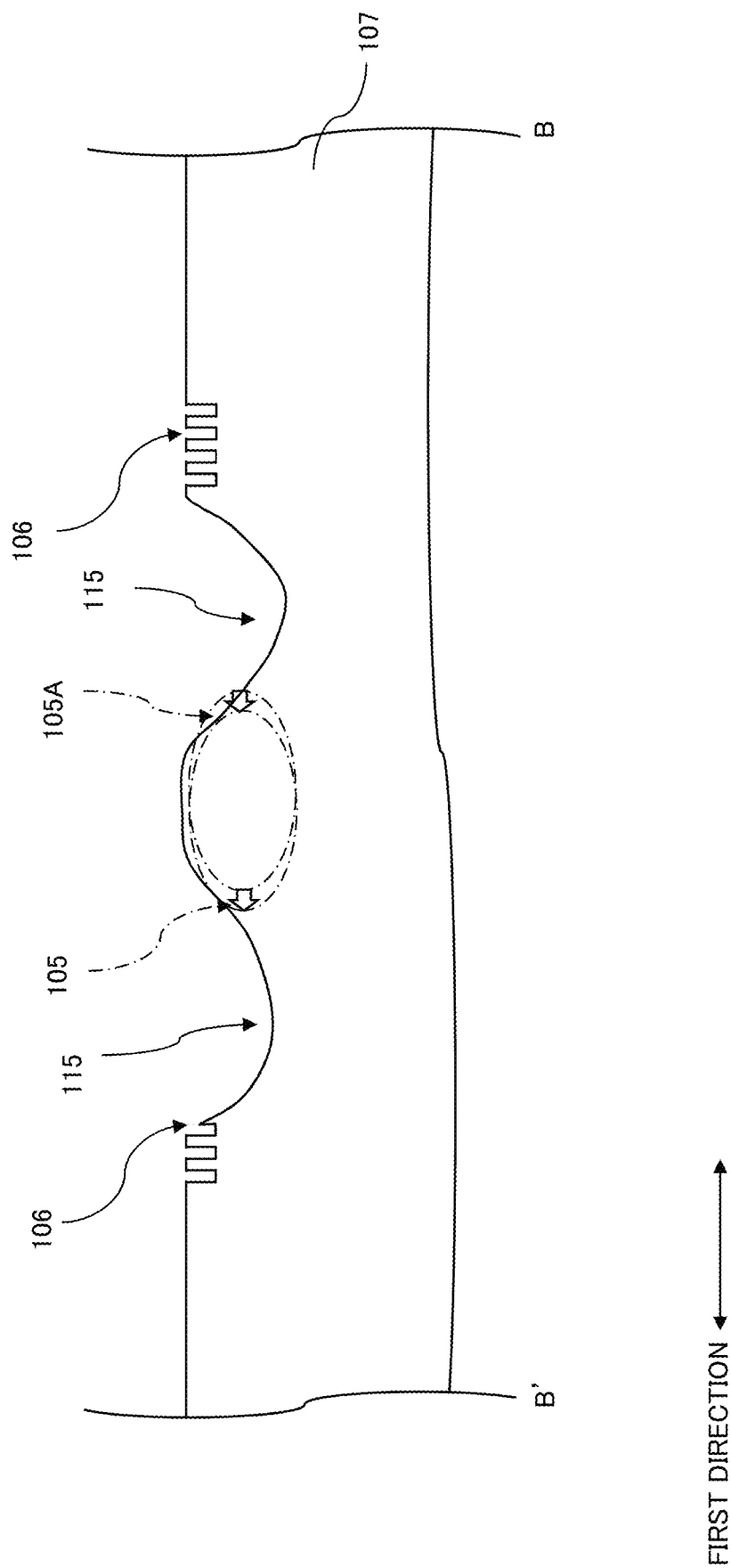
FIG. 16 is a schematic cross-sectional view illustrating a manufacturing process in the B-B' cross section of FIG. 2.
Figure 17:
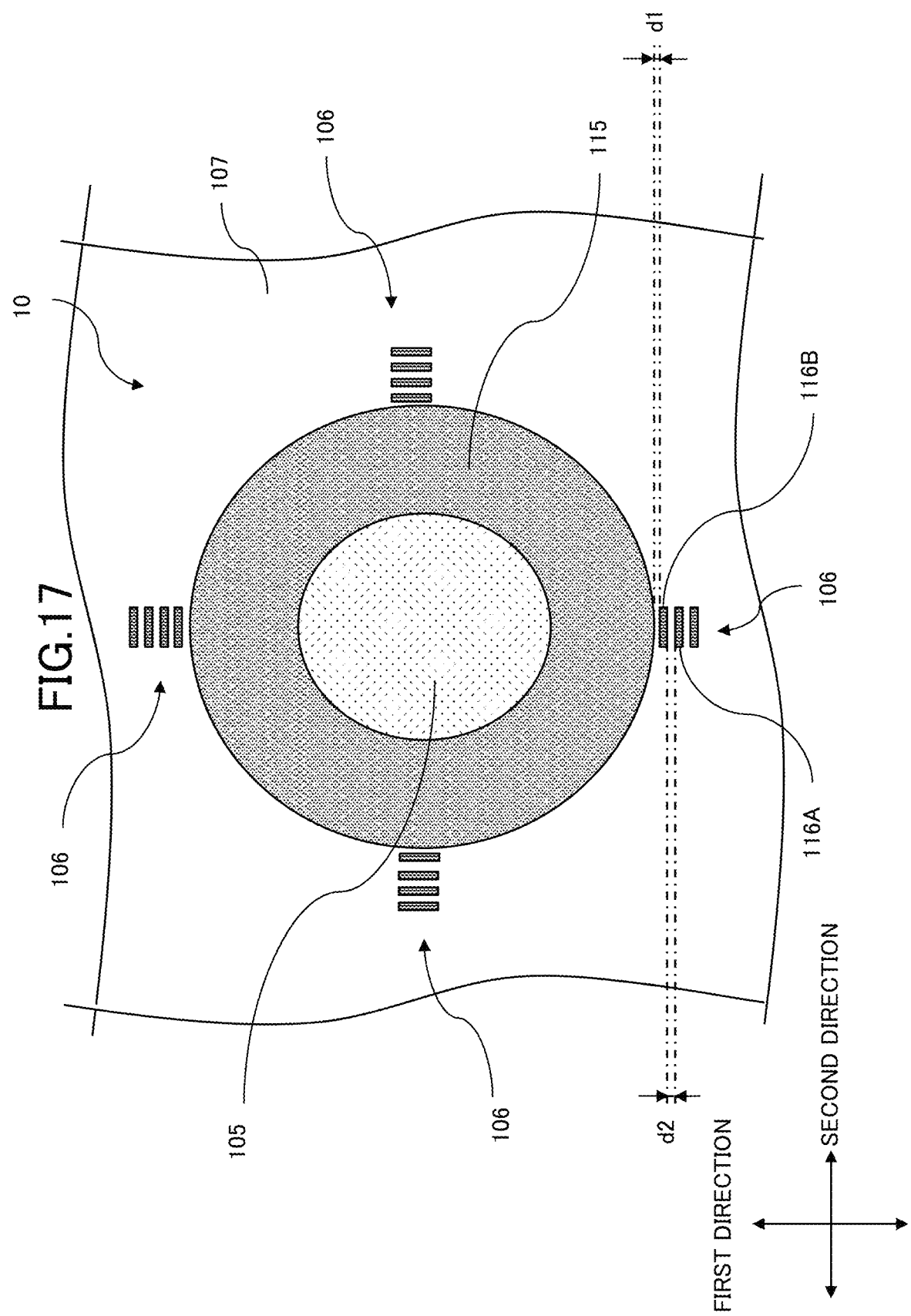
FIG. 17 is a schematic plan view illustrating a manufacturing process of the rear surface of the photoelectric conversion element according to the first example.

Therefore, as illustrated in FIGS. 16 and 17, it is understood that when the mask 121 provided to protect the pattern 106 is removed, a part of the pattern 106 disposed in the first direction with respect to the lens-shaped convex portion 105 disappears. That is, while there are four grooves on one side in the first direction, only three grooves remain on the other side in the first direction, and one groove has disappeared. Therefore, by observing the shape of the pattern 106, the direction of distortion generated in the lens-shaped convex portion 105 can be detected.

As a result, when the photoelectric conversion element 10 is incorporated into the optical subassembly 100, the optical axis incident on the photoelectric conversion element 10 can be adjusted according to the direction of distortion generated in the lens-shaped convex portion 105.

Furthermore, in the present implementation, since the pattern 106 has a shape in which a plurality of portions are aligned in the first direction and the second direction, not only the distortion direction but also the distortion amount can be detected. For example, in the examples illustrated in FIGS. 16 and 17, the distortion amount can be detected by visually counting the number of lost grooves.

As a result, before incorporating the photoelectric conversion element 10 into the optical subassembly 100, a non-defective product can be selected from the plurality of photoelectric conversion elements 10, and the yield of the optical subassembly 100 can be improved. Further, when the photoelectric conversion element 10 is incorporated into the optical subassembly 100, the adjustment angle of the optical axis incident on the photoelectric conversion element 10 can be increased or decreased according to the amount of distortion generated in the lens-shaped convex portion 105.

In addition, when processing the first region 105A into the lens-shaped convex portion 105 by the wet etching described above, the annular concave portion 115 is widened to the outer peripheral side by side etching. In the example illustrated in FIG. 17, the pattern 106 includes a first portion 116A disposed apart from the annular concave portion 115 in the first direction, and a second portion 116B disposed apart from the first portion between the concave portion 115 and the first portion 116A. Then, since the annular concave portion 115 is widened to the outer peripheral side by side etching, the distance d1 between the second portion 116B and the concave portion 115 is smaller than the distance d2 between the first portion 116A and the second portion 116B.

Figure 18:
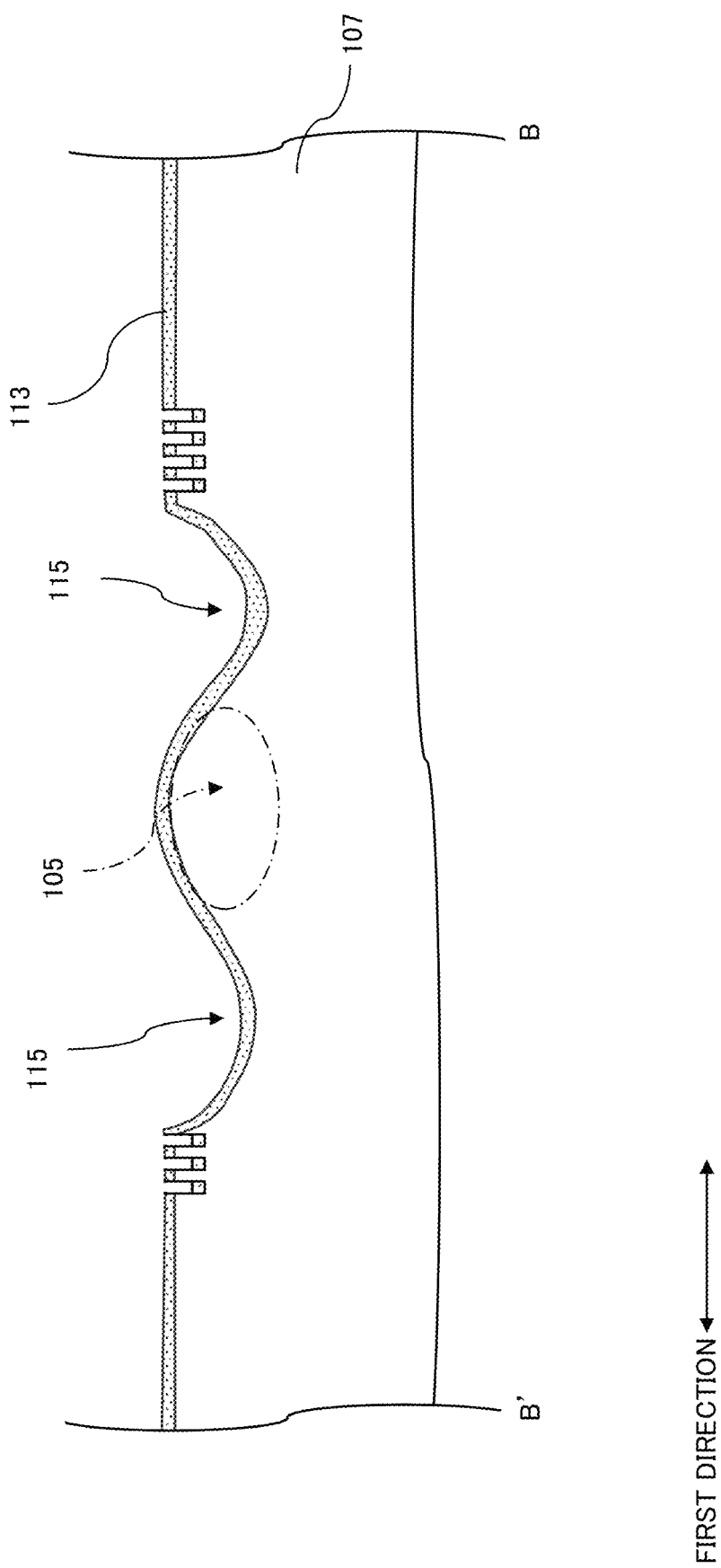
FIG. 18 is a schematic cross-sectional view illustrating a manufacturing process in the B-B' cross section of FIG. 2.

Thereafter, as illustrated in FIG. 18, a low reflection film 113 is formed on the rear surface (first main surface) side of the substrate 107 by sputtering, and the wafer process is completed.

After the wafer is separated into pieces by dicing, an appearance inspection is performed on the rear surface (first main surface) of the substrate 107 on which the lens-shaped convex portion 105 is formed. At this time, by observing the shape of the pattern 106, the direction of distortion generated in the lens-shaped convex portion 105 is detected. Further, the distortion amount is detected by visually counting the number of lost grooves. Those having a large amount of distortion are excluded as defective products, and those having a small amount of distortion are selected as non-defective products. Then, the light incident condition to the photoelectric conversion element 10 in the optical subassembly 100 is adjusted according to the detected distortion direction and distortion amount. The appearance inspection may be performed by human eyes using a microscope or the like, but in mass production, it is desirable in terms of cost to inspect with a machine. Appearance inspection is generally performed with a camera. However, in order to accurately recognize the position and shape of the lens-shaped convex portion 105, a high-precision camera using laser irradiation (reflected light thereof) is required instead of a simple camera, and there is a concern of increasing the inspection time. However, according to the present implementation, it is possible to sufficiently recognize the distortion direction by looking at the positions of the edges of the pattern 106 and the concave portion 115, and the inspection can be performed using a simple camera in a short time.

Figure 19:
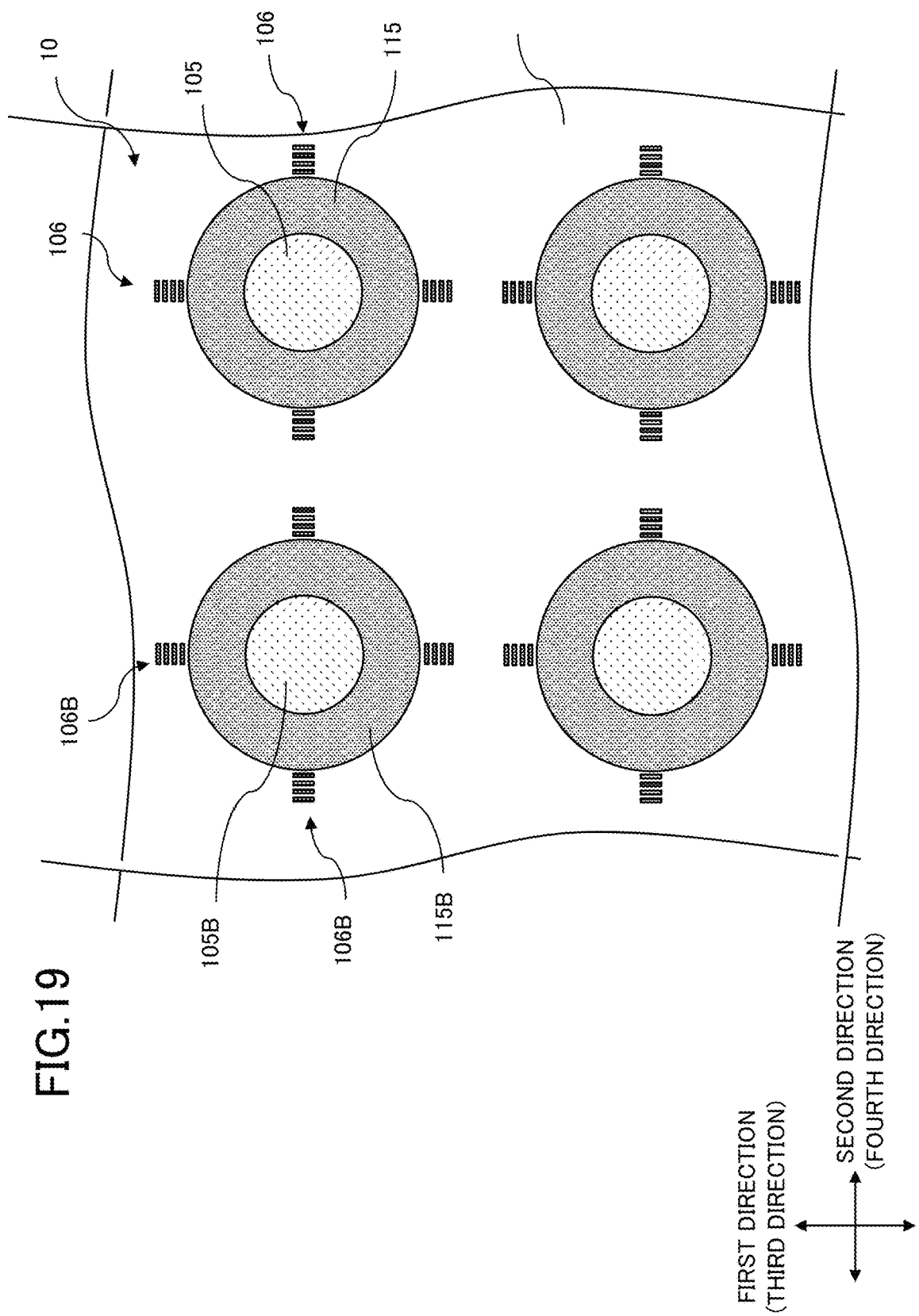
FIG. 19 is a schematic plan view illustrating an example in which lens-shaped convex portions are formed in an array on a first main surface of the substrate in the photoelectric conversion element according to the first example.
Figure 20:
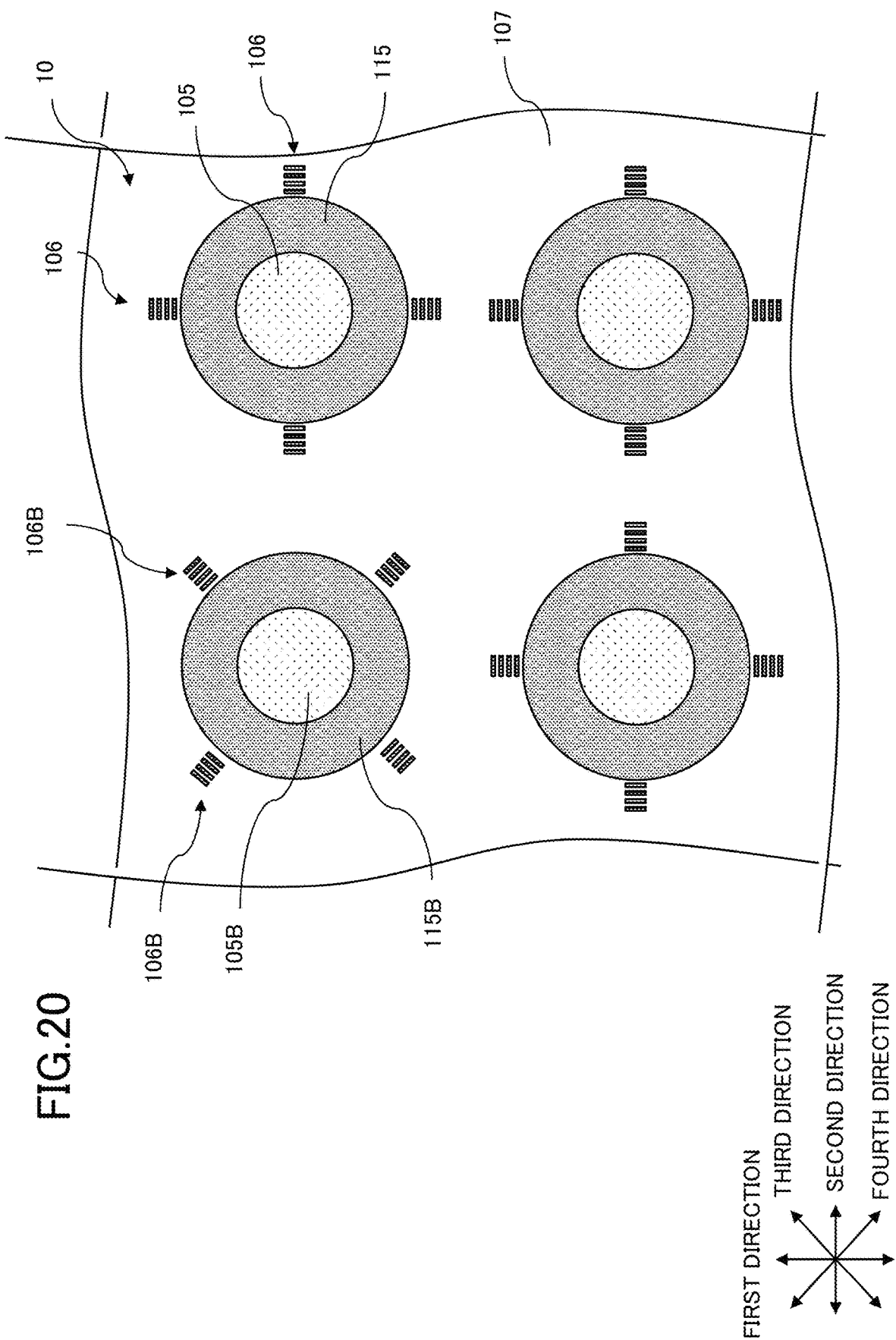
FIG. 20 is a schematic plan view illustrating an example in which lens-shaped convex portions are formed in an array on the first main surface of the substrate in the photoelectric conversion element according to the first example.
Figure 21:
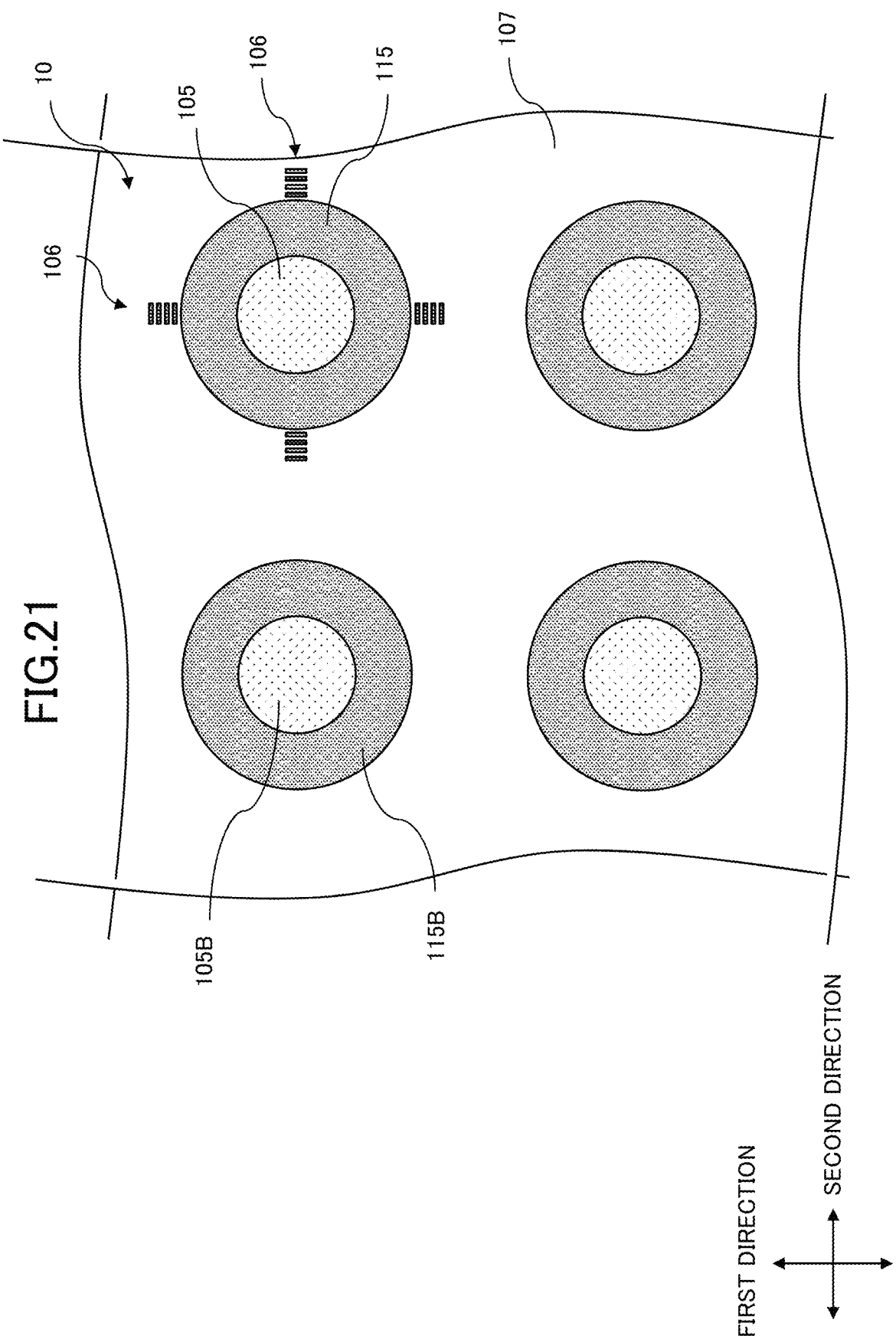
FIG. 21 is a schematic plan view illustrating an example in which lens-shaped convex portions are formed in an array on the first main surface of the substrate in the photoelectric conversion element according to the first example.

The optical subassembly 100 is required to be further miniaturized, and a high-density mounting technique is required. Therefore, it is desired to reduce the mounting area by arraying optical system components. FIGS. 19, 20, and 21 are schematic plan views illustrating a configuration in which lens-shaped convex portions 105 are formed in an array on the rear surface (first main surface) of the substrate 107. That is, a plurality of lens-shaped convex portions 105 are disposed on the rear surface (first main surface) of the substrate 107.

In the example illustrated in FIGS. 19, 20, and 21, a lens-shaped second surface 105B is disposed in a position adjacent to the above-described lens-shaped convex portion 105 in the second direction on the rear surface (first main surface) of the substrate 107, and an annular second concave portion 115B surrounding the second convex portion 105B is disposed.

Further, in the example illustrated in FIG. 19, the photoelectric conversion element 10 further includes a second pattern 106B disposed on the outer surface side of the second concave portion 115B on the rear surface (first main surface) side of the substrate 107, and disposed to interpose the second convex portion 105B from a third direction and a fourth direction intersecting the third direction. In the example illustrated in FIG. 19, the first direction and the third direction are the same, and the second direction and the fourth direction are the same. However, as illustrated in FIG. 20, the first direction and the third direction may be different, and the second direction and the fourth direction may be different.

The example illustrated in FIG. 21 illustrates a configuration in which the second pattern 106B described above is not provided on the outer peripheral side of the second concave portion 115B on the rear surface (first main surface) side of the substrate 107. As described above, the distortion generated in the lens-shaped convex portion 105 is generated by the flow of the chemical solution in the beaker in the wet etching process. Since the flow of the chemical solution is in substantially the same direction within a limited range, for example, the convex portion 105 and the second convex portion 105B that are disposed adjacent to each other have distortion in substantially the same direction. For this reason, even if the second pattern 106B is not provided, by observing only the pattern 106 disposed to interpose the convex portion 105 from two directions, the direction of distortion generated in the convex portion 105 and the second convex portion 105B can be detected. For this reason, for example, the pattern 106 disposed to interpose one lens-shaped convex portion 105 included in each unit such as each address or each bar from two directions may be formed.

In the example described above, the example in which the photoelectric conversion element 10 is a light receiving element having the light absorption layer 117 has been described. However, the present disclosure is not limited thereto, and the photoelectric conversion element 10 may be a light emission element having an active layer. For example, the photoelectric conversion element 10 may be a horizontal cavity surface-emitting laser as illustrated in FIG. 22.

Figure 22:
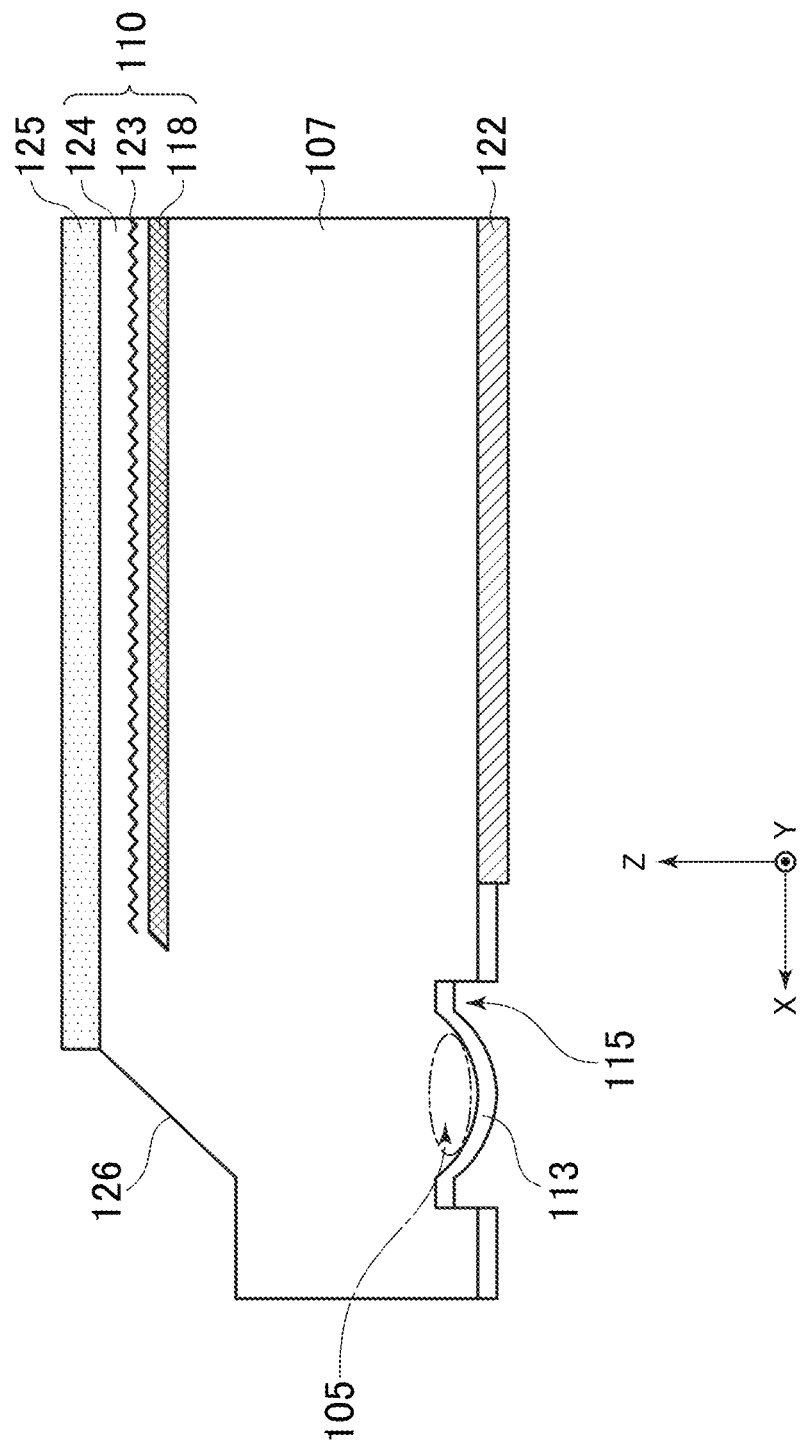
FIG. 22 is a schematic cross-sectional view of a photoelectric conversion element according to another example of the first example.

FIG. 22 is a cross-sectional view taken along a plane parallel to the light traveling direction. The substrate 107 is, for example, an n-type InP substrate. An active layer 118 serving as a photoelectric conversion layer included in the semiconductor multilayer 110 is provided on the front surface (second main surface) side of the substrate 107. The active layer 118 has, for example, a stacked structure of an n-type InGaAlAs light confinement layer, an InGaAlAs distortion multiple quantum well layer, and a p-type InGaAlAs light confinement layer. Above the active layer 118, for example, a diffraction grating 123 made of an InGaAsP-based material is disposed. The optical confinement layer provided with the quantum well layer interposed therebetween is a layer for enhancing the optical confinement of the quantum well layer. The optical waveguide function is generated by interposing the core region with p-type and n-type cladding layers having a lower refractive index than that of the core region, and the optical waveguide function is realized by the stacked structure of the cladding layer, the quantum well layer, and the cladding layer.

A p-type cladding layer 124 made of, for example, p-type InP is disposed above the diffraction grating 123, and a p-type electrode 125 is further disposed above the p-type cladding layer 124. An n-type cladding layer may be disposed between the substrate 107 and the n-type InGaAlAs light confinement layer. As described above, the horizontal cavity surface-emitting laser has a semiconductor multilayer 110 including an n-type cladding (not illustrated), the active layer 118, the diffraction grating layer 123, and the p-type cladding layer 124 on the second main surface side of the substrate 107 made of, for example, n-type InP.

Further, the lens-shaped convex portion 105 and the annular concave portion 115 surrounding the lens-shaped convex portion 105 are formed on the rear surface (first main surface) of the substrate 107. The method for forming the lens-shaped convex portion 105 is as described above.

Light is generated by injecting current into the active layer 118 from an n-type electrode 122 provided on the rear surface (first main surface) of a substrate 107 and the p-type electrode 125 on the front surface (second main surface) of the substrate 107. The generated light is confined in the Z direction by an optical confinement structure constituted of the p-type cladding layer 124, the active layer 118 and the substrate 107. In the Y direction, the generated light is confined by arranging two semi-insulating InP layers to interpose the active layer 118 from the Y direction. Thus, the light confined in the Y direction and the Z direction is propagated in the X direction. The diffraction grating 123 whose refractive index changes periodically is formed in the X direction in which the light propagates. Light is fed back by the diffraction grating 123 and laser oscillation of a single wavelength occurs. The laser beam thus generated is totally reflected by a reflecting mirror 126 formed by etching one end of the waveguide path at an angle of 45° and is guided to the direction of the rear surface (first main surface) of the substrate 107. The above-described lens-shaped convex portion 105 is formed at a portion opposed to the reflecting mirror 126 on the rear surface (first main surface) of the substrate 107, and the laser beam is emitted from the convex portion 105. That is, the active layer 118 which is the photoelectric conversion layer is positioned on the optical path of the light passing through the convex portion 105. Furthermore, the reflecting mirror 126 is overlapped on the lens-shaped convex portion when viewed from the direction orthogonal to the first main surface (Z direction in FIG. 22).

Here, the pattern 106, which is disposed on the outer peripheral side of the annular concave portion 115 and disposed to interpose the convex portion 105 from the first direction and the second direction intersecting the first direction, is disposed on the rear surface (first main surface) of the substrate 107, as illustrated in FIG. 23. As described above, it is possible to detect the direction of distortion generated in the lens-shaped convex portion 105 by providing the pattern 106 disposed to interpose the lens-shaped convex portion 105 from two directions intersecting each other on the rear surface (first main surface) side of the substrate 107, and by observing the shape of the pattern 106 after the wet etching process, the distance between the pattern 106 and the annular concave portion 115, and the like.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A photoelectric conversion element comprising:
   a substrate including a lens-shaped convex portion and an annular concave portion surrounding the lens-shaped convex portion on a first main surface;
   a photoelectric conversion layer, positioned on an optical path of light passing through the lens-shaped convex portion, on a second main surface side of the substrate; and
   a pattern disposed on an outer peripheral side of the annular concave portion on the first main surface and disposed to interpose the lens-shaped convex portion from a first direction and a second direction intersecting the first direction,
   wherein the pattern is a groove provided on the first main surface.

2. The photoelectric conversion element of claim 1, wherein the pattern includes:
   a first portion disposed apart from the annular concave portion in the first direction, and
   a second portion disposed apart from the first portion between the annular concave portion and the first portion.

3. The photoelectric conversion element of claim 2, wherein a distance between the second portion and the annular concave portion is smaller than a distance between the first portion and the second portion.

4. The photoelectric conversion element of claim 1, wherein the pattern is a groove provided on the first main surface, and a depth of the groove is shallower than a depth of the annular concave portion.

5. The photoelectric conversion element of claim 1, wherein
   the pattern is disposed in a concentric circle centering on a part of the lens-shaped convex portion.

6. The photoelectric conversion element of claim 1, wherein
   the substrate further includes a lens-shaped second convex portion and an annular second concave portion surrounding the lens-shaped second convex portion on the first main surface.

7. The photoelectric conversion element of claim 6, further comprising a second pattern disposed on an outer peripheral side of the annular second concave portion on the first main surface and disposed to interpose the lens-shaped second convex portion from a third direction and a fourth direction intersecting the third direction.

8. An optical subassembly comprising:
   a photoelectric conversion element comprising:
      a substrate including a lens-shaped convex portion and an annular concave portion surrounding the lens-shaped convex portion on a first main surface;
      a photoelectric conversion layer, positioned on an optical path of light passing through the lens-shaped convex portion, on a second main surface side of the substrate; and
      a pattern disposed on an outer peripheral side of the annular concave portion on the first main surface and disposed to interpose the lens-shaped convex portion from a first direction and a second direction intersecting the first direction;
   a package housing the photoelectric conversion element therein; and
   an optical element housed in the package and making light incident on the photoelectric conversion element.

9. The optical subassembly of claim 8, wherein the pattern includes:
   a first portion disposed apart from the annular concave portion in the first direction, and
   a second portion disposed apart from the first portion between the annular concave portion and the first portion.

10. The optical subassembly of claim 9, wherein a distance between the second portion and the annular concave portion is smaller than a distance between the first portion and the second portion.

11. The optical subassembly of claim 8, wherein the pattern is a groove provided on the first main surface, and a depth of the groove is shallower than a depth of the annular concave portion.

12. The optical subassembly of claim 8, wherein
   the pattern is disposed in a concentric circle centering on a part of the lens-shaped convex portion.

13. The optical subassembly of claim 8, wherein
   the substrate further includes a lens-shaped second convex portion and an annular second concave portion surrounding the lens-shaped second convex portion on the first main surface.

14. The optical subassembly of claim 13, further comprising a second pattern disposed on an outer peripheral side of the annular second concave portion on the first main surface and disposed to interpose the lens-shaped second convex portion from a third direction and a fourth direction intersecting the third direction.

15. A method for manufacturing a photoelectric conversion element forming a lens-shaped convex portion in a first region on a first main surface of a substrate, comprising:
   forming a photoelectric conversion layer positioned on an optical path of light passing through the lens-shaped convex portion on a second main surface side of the substrate;

forming a pattern to interpose the first region from a first direction and a second direction intersecting the first direction on the first main surface;

forming a mask for protecting at least a part of the pattern and the first region;

forming, after the mask is formed, an annular concave portion surrounding the first region between the first region and the pattern;

removing, after the annular concave portion is formed, the mask; and processing, after the mask is removed, the first region into the lens-shaped convex portion by wet etching.

16. The method of claim 15, wherein, when the pattern is formed, a first portion disposed apart from the annular concave portion in the first direction and a second portion disposed apart from the first portion between the annular concave portion and the first portion are formed.

17. The method of claim 16, wherein, when the first region is processed into the lens-shaped convex portion by wet etching, the annular concave portion is widened to an outer peripheral side by side etching, and a distance between the second portion and the annular concave portion is smaller than a distance between the first portion and the second portion.

18. The method of claim 15, wherein the pattern is formed by dry etching the first main surface.

19. The method of claim 15, wherein a depth of the pattern is formed shallower than a depth of the annular concave portion.

20. The method of claim 15, wherein the pattern is formed in a concentric circle centering on a part of the first region.

* * * * *